(12) United States Patent
Liu et al.

(10) Patent No.: US 7,999,321 B2
(45) Date of Patent: Aug. 16, 2011

(54) FIELD-EFFECT TRANSISTOR AND INTEGRATED CIRCUIT INCLUDING THE SAME

(75) Inventors: Yongxun Liu, Tsukuba (JP); Takashi Matsukawa, Tsukuba (JP); Meishoku Masahara, Tsukuba (JP); Kazuhiko Endo, Tsukuba (JP); Shinichi Ouchi, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 51 days.

(21) Appl. No.: 12/602,314

(22) PCT Filed: May 9, 2008

(86) PCT No.: PCT/JP2008/058604
§ 371 (c)(1),
(2), (4) Date: Nov. 30, 2009

(87) PCT Pub. No.: WO2008/146586
PCT Pub. Date: Dec. 4, 2008

(65) Prior Publication Data
US 2010/0213546 A1 Aug. 26, 2010

(30) Foreign Application Priority Data
May 29, 2007 (JP) .................................. 2007-142045

(51) Int. Cl.
*H01L 27/12* (2006.01)

(52) U.S. Cl. .. 257/347; 257/353; 257/401; 257/E29.137

(58) Field of Classification Search .................. 257/347, 257/353, 401, E29.137
See application file for complete search history.

(56) References Cited

U.S. PATENT DOCUMENTS

| | | | |
|---|---|---|---|
| 7,511,994 B2 * | 3/2009 | Aritome | 365/185.01 |
| 2002/0130354 A1 | 9/2002 | Sckigawa et al. | |
| 2007/0029623 A1 | 2/2007 | Liu et al. | |

FOREIGN PATENT DOCUMENTS

| | | |
|---|---|---|
| JP | 2002270850 A | 9/2002 |
| JP | 2005167163 A | 6/2005 |

OTHER PUBLICATIONS

N. Abele, et al. "Suspended-Gate MOSFET: bring new MEMS functionality into solid-state MOS transistor" IEDM Tech. Dig., 2005, pp. 1075-1077.

(Continued)

*Primary Examiner* — Tu-Tu Ho
(74) *Attorney, Agent, or Firm* — Volpe and Koenig P.C.

(57) ABSTRACT

A field-effect transistor comprising a movable gate electrode that suppresses a leakage current from the gate electrode, and has a large current drivability and a low leakage current between a source and a drain. The field-effect transistor comprises: an insulating substrate; a semiconductor layer of triangle cross-sectional shape formed on the insulating substrate, having a gate insulation film on a surface, and forming a channel in a lateral direction; fixed electrodes that are arranged adjacent to both sides of the semiconductor layer and in parallel to the semiconductor layer, each of the electrodes having an insulation film on a surface; a source/drain formed at the end part of the semiconductor layer; and the movable gate electrode formed above the semiconductor layer and the fixed electrodes with a gap.

17 Claims, 20 Drawing Sheets

(A-A' SECTIONAL VIEW)

OTHER PUBLICATIONS

H. Kam et al. "A New Nano-Electrical Field Effect Transistor NEMFET) Design for Low-Power Electronics" IEDM Tech. Dig., 2005, pp. 477-480.

Ionescu et al "Modeling and Design of a Low-voltage SOI Suspended-Gate MOSFET (SG-MOSFET) with a Metal-Over-Gate Architecture" Proceedings of the International Symposium on Quality Electronic Design May 18, 2002, P. 496-601.

Dadgour et al "Design and Analysis of Hybrid NEMS-CMOS Circuits for Ultra Low-Power Applications" Design Automation Conference, Jun. 4, 2007, p. 306-311.

* cited by examiner (PLAN VIEW)

(A-A' SECTIONAL VIEW)

(B-B' SECTIONAL VIEW)

(PLAN VIEW)

$t_1 t_2 \quad t_1 = t_2$ (A-A' SECTIONAL VIEW)

(B-B' SECTIONAL VIEW)

(PLAN VIEW)

$t_1 t_2 \quad t_1 = t_2$ (A-A' SECTIONAL VIEW)

(B-B' SECTIONAL VIEW)

(PLAN VIEW)

(A-A' SECTIONAL VIEW)

(B-B' SECTIONAL VIEW)

(PLAN VIEW)

(A-A' SECTIONAL VIEW)

(B-B' SECTIONAL VIEW)

(PLAN VIEW)

(A-A' SECTIONAL VIEW)

(B-B' SECTIONAL VIEW)

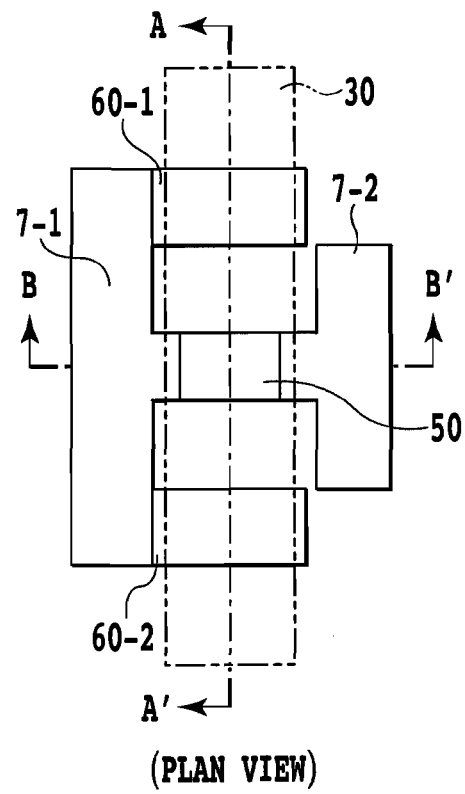
FIG.37 (PLAN VIEW)
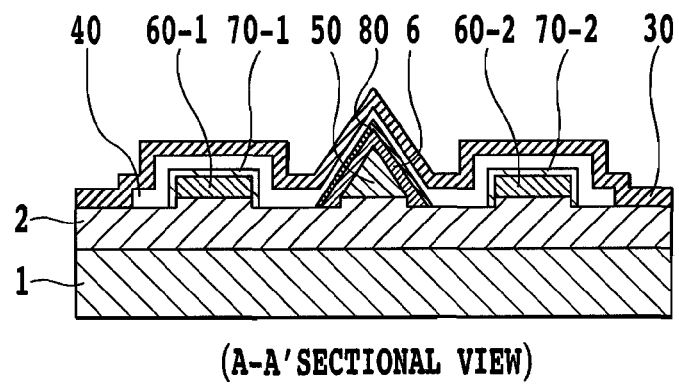
FIG.38 (A-A' SECTIONAL VIEW)
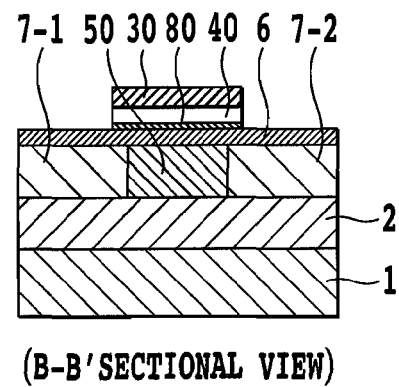
FIG.39 (B-B' SECTIONAL VIEW)

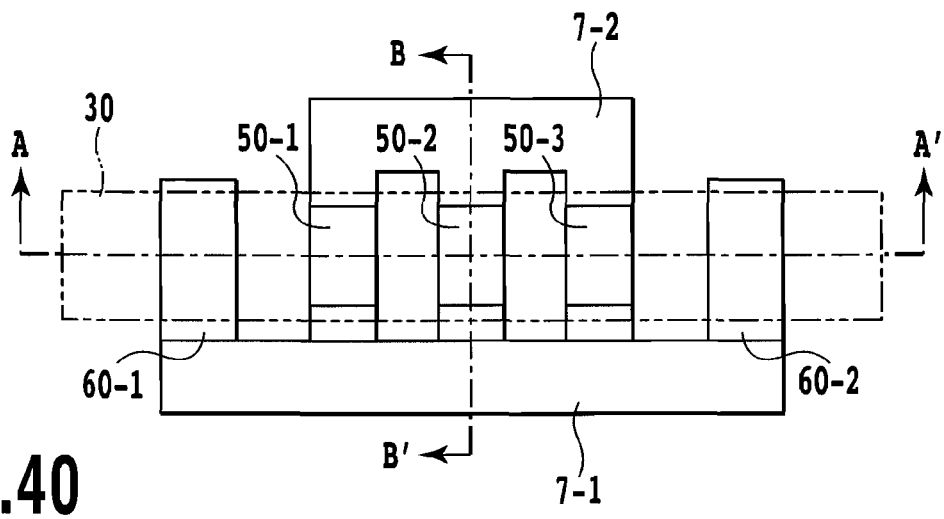
FIG.40 (PLAN VIEW)
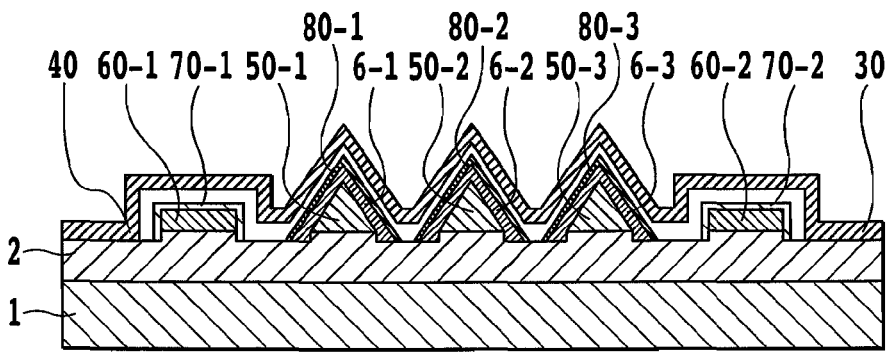
FIG.41 (A-A' SECTIONAL VIEW)
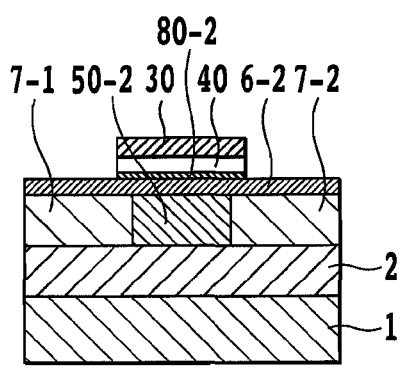
FIG.42 (B-B' SECTIONAL VIEW)

FIELD-EFFECT TRANSISTOR AND INTEGRATED CIRCUIT INCLUDING THE SAME

TECHNICAL FIELD

The present invention relates to a field-effect transistor having a movable gate electrode and to an integrated circuit including the same.

BACKGROUND ART

A silicon integrated circuit has been made large-scaled and high-performanced according to the Moore's law so far and has supported an advanced information technology (IT) society in terms of hardware. It is expected that the trend will continue from now on. However, in a usual bulk CMOS circuit, scaling limit in a close future has begun to be apprehended. The main cause includes an increase of a leakage current accompanying the scaling of a transistor, a switching characteristic deterioration (an increase of a sub-threshold coefficient) of a transistor, or the like. That is, the seriousness of the problem exists in that the more progresses the technology node, the more increases the percentage of an ineffective electrical power caused by the leakage current other than an operating power.

In order to conquer this essential difficulty, it is expressed in the ITRS Road map that an ultra-thin body completely-depleted SOI (Silicon-on-Insulator) device, a double-gate/multi-gate MOSFET, or the like will be introduced in the early 2010's. Among them, especially, a Fin type double-gate MOS field-effect transistor having a standing lateral channel with a simple fabricating process of a self-aligned double gate attracts attention from the world as a promising device candidate after 32 nm node.

However, even in this double-gate MOS field-effect transistor, when a gate length of the device is reduced to 20 nm or less (corresponding to the technology after the 32 nm node), it is not easy to suppress completely the leakage current caused by short channel effect and the increase of the sub-threshold coefficient.

Because a standing Si-Fin channel 5 is formed so as to be sandwiched with a gate material 3 in a conventional fin (Fin) type double gate MOS field-effect transistor structure illustrated in FIGS. 1 to 3, the potential of the channel will be strongly controlled by a gate electrode located on both sides of the channel. Therefore, such double gate structure is effective in suppression of the leakage current between a source 7-1 and a drain 7-2. However, because gate insulation films 6-1 and 6-2 have been thinned as the device is fined, the increase of a gate leakage current caused by tunneling effect, GIDL (Gate-Induced Drain Leakage), etc. has become a problem. The sub-threshold coefficient deterioration caused by the short channel effect has also been aggravated.

In a four terminal fin type MOS field-effect transistor structure (Patent Document 1) illustrated in FIGS. 4-6 in which gates 3-1 and 3-2 are separated physically and insulated electrically, the two gate insulation films at both sides of the channel 5 become the same in thickness since the gate insulation films 6-1 and 6-2 are formed at the same time on both sides of the channel. In this case, the transistor can be operated with a fixed potential by biasing on one of the two gates and by inputting a driving signal into the other. Although a threshold voltage of the transistor can be controlled by changing the value of the fixed potential, there exists a disadvantage that the sub-threshold coefficient increases rapidly.

As a patent that solves this problem, a four terminal fin type MOS field-effect transistor having an asymmetrical gate insulation films 6-1 and 6-2 illustrated in FIGS. 7 to 9 is proposed (Patent Document 2). In this device structure, by making the control side gate insulation film 6-2 thicker than the driving side gate insulation film 6-1, the problem of rapid increase in the sub-threshold coefficient is solved, and at the same time the threshold voltage is controlled.

However, in the above-mentioned conventional fin type MOS field-effect transistor, the gate leakage current caused by the thinning of the gate insulation film, GIDL, and the deterioration of the sub-threshold coefficient accompanying the device scaling or the like is not taken into consideration. In order to improve such problems, a conventional planer type MOS field-effect transistor having a movable gate electrode illustrated in FIGS. 10 to 12 is proposed (Non-patent Documents 1 and 2).

As a feature of a device structure like this, there exists a superiority that a movable gate electrode 30 is separated from the gate insulation film 6 at the time of device standby, and hence the leakage current from the gate to the channel becomes zero because of a space 40. When a voltage is applied on the gate, the movable gate electrode 30 is attached firmly to the gate insulation film 6 by electrostatic attraction force based on a potential difference between the movable gate electrode and the channel, and an electric current flows between the source 7-1 and the drain 7-2. However, since the device structure is the same as that of a conventional single gate MOS field-effect transistor, the current drivability is inferior to that of the double gate field-effect transistor. Moreover, there exists a problem that, when the gate electrode is separated from the gate insulation film 6 (when a voltage is not applied on the gate), the leakage current between the source and the drain increases rapidly as the device is scaled down. That is, in the case of short channel, there exists a problem that the leakage current between the source and the drain increases rapidly.

[Patent Document 1] Japanese Patent Laid-Open No. 2002-270850
[Patent Document 2] Japanese Patent Laid-Open No. 2005-167163
[Non-Patent Document 1] N. Abele, et al., "Suspended-Gate MOSFET: bring new MEMS functionality into solid-state MOS transistor", IEDM Tech. Dig., 2005, pp. 1075 to 1077.
[Non-Patent Document 2] H. Kam, et al., "A New Nano-Electrical Field Effect Transistor (NEMFET) Design for Low-Power Electronics", IEDM Tech. Dig., 2005, pp. 477 to 480.

SUMMARY

An object of the present invention is to provide a field-effect transistor with a movable gate electrode that suppresses a leakage current from a gate electrode, and that has a large current drivability and a low leakage current between a source and a drain.

An object of the present invention is also to enable sure performance of the movable operation of a field-effect transistor with a movable gate electrode.

The above mentioned objects are solved by the following means.

(1) A field-effect transistor, comprising: an insulating substrate; a semiconductor layer with a triangle cross-sectional shape formed on the insulating substrate, the semiconductor layer having a gate insulation film on a surface and forming a channel in a lateral direction; fixed electrodes arranged adjacent to both sides of the semiconductor layer and in parallel with the semiconductor layer, each of the fixed electrodes having an insulation film on a surface; a source/drain formed at the end part of the semiconductor layer; and a movable gate electrode formed above the semiconductor layer and the fixed electrodes with a gap.

(2) The field-effect transistor according to (1), wherein the transistor is in a state (ON state) where a current flows between the source and the drain when the gate electrode is firmly attached to the gate insulation film, and wherein the transistor is in a state (OFF state) where a current does not flow between the source and the drain when the gate electrode is separated from the gate insulation film.

(3) The field-effect transistor according to (1) or (2), wherein depending on existence or nonexistence of a voltage application between the fixed electrodes and the movable gate electrode, the movable gate electrode is firmly attached to the gate insulation film by utilizing an electrostatic attraction force caused between the movable gate electrode and the fixed electrodes, and the movable gate electrode is separated from the gate insulation film by utilizing a restoring force based on a spring effect of the movable gate electrode.

(4) A field-effect transistor, comprising: an insulating substrate; a semiconductor layer of triangle cross-sectional shape formed on the insulating substrate, the semiconductor layer having a gate insulation film on a surface and forming a channel in a lateral direction; fixed electrodes that are arranged adjacent to both sides of the semiconductor layer and in parallel with the semiconductor layer, each of the fixed electrodes having an insulation film on a surface; a source/drain formed at the end part of the semiconductor layer; and a movable gate electrode formed above the semiconductor layer and the fixed electrodes with a gap, wherein the field-effect transistor further comprises a thin film fixed gate electrode on the gate insulation film.

(5) The field-effect transistor according to (4), wherein the field-effect transistor is in a state (ON state) where a current flows between the source and the drain when the gate electrode is firmly attached to the thin film fixed gate electrode on the gate insulation film, and wherein the transistor is in a state (OFF state) where a current does not flow between the source and the drain when the gate electrode is separated from the thin film fixed gate electrode on the gate insulation film.

(6) The field-effect transistor according to (4) or (5), wherein depending on existence or nonexistence of a voltage application between the fixed electrodes and the movable gate electrode, the movable gate electrode is firmly attached to the thin film fixed gate electrode by utilizing an electrostatic attraction force caused between the movable gate electrode and the fixed electrodes, and the movable gate electrode is separated from the thin film fixed gate electrode by utilizing a restoring force based on a spring effect of the movable gate electrode.

(7) The field-effect transistor according to any one of (4) to (6), wherein a potential of the thin film fixed gate electrode can be controlled independently.

(8) The field-effect transistor according to any one of (1) to (7), wherein the fixed electrode is electrically connected with a source electrode region.

(9) The field-effect transistor according to any one of (1) to (8), wherein the channel in the lateral direction is two or more multi-channels.

(10) The field-effect transistor according to any one of (1) to (9), wherein the insulating substrate is a SOI substrate, and wherein the surface of both sides of the channel in the lateral direction of triangle cross-sectional shape is crystalline silicon with (111) orientation.

(11) An integrated circuit comprising the field-effect transistor according to any one of (1) to (10).

According to the present invention, provided is a field-effect transistor with a movable gate electrode that suppresses a leakage current from a gate electrode, and has a large current drivability and a low leakage current between a source and a drain. In addition, by providing a fixed electrode, when a voltage is applied to the movable gate electrode, the movable gate electrode is surely attached to a gate insulation film or a thin film fixed gate electrode by the electrostatic attraction force caused between the movable gate and the fixed electrodes, and a current can be made to flow between the source and the drain. When a voltage is not applied to a movable gate electrode, by a restoring force based on a spring effect of the movable gate electrode, the movable gate is separated from the gate insulation film or the thin film fixed gate electrode to form a gap between the movable gate electrode and the gate insulation film or the thin film fixed gate electrode. Thereby, a gate leakage current at the time of standby becomes zero.

BRIEF DESCRIPTION OF THE DRAWINGS

FIG. 37 is a plan view of a movable gate field-effect transistor having a thin film fixed gate electrode and a triangle cross-sectional shape channel according to the third embodiment of the present invention;

FIG. 38 is a A-A' sectional view of FIG. 37;

FIG. 39 is a B-B' sectional view of FIG. 37;

FIG. 40 is a plan view of a movable gate field-effect transistor with multi-channels of triangle cross-sectional shape, each of which having a thin film fixed gate electrode, according to the fourth embodiment of the present invention;

FIG. 41 is a A-A' sectional view of FIG. 40;

FIG. 42 is a B-B' sectional view of FIG. 41;

DETAILED DESCRIPTION OF THE PREFERRED EMBODIMENTS

Explanation of Reference

1: SUBSTRATE,
2: EMBEDDED OXIDE FILM,
3, 3-1, 3-2: FIXED GATE ELECTRODE,
4: INSULATING FILM,
5: FIN TYPE CHANNEL OF CRYSTALLINE SILICON,
6, 6-1, 6-2, 6-3: GATE INSULATION FILM,
7-1, 7-2, 7-3, 7-4: SOURCE/DRAIN REGION,
8: INSULATION FILM,
13-1, 13-2: INSULATION FILM,

30: MOVABLE GATE ELECTRODE,
40: GAP BETWEEN GATE INSULATION FILM AND MOVABLE GATE ELECTRODE,
50, 50-1, 50-2, 50-3: TRIANGLE CROSS-SECTIONAL SHAPE CHANNEL OF CRYSTALLINE SILICON,
50-4: PLANER TYPE CHANNEL OF CRYSTALLINE SILICON,
60-1, 60-2: FIXED ELECTRODE,
70-1, 70-2: INSULATION FILM, and
80, 80-1, 80-2, 80-3: THIN FILM FIXED GATE ELECTRODE.

BEST MODE FOR CARRYING OUT THE INVENTION

A field-effect transistor according to the present invention is described in detail below with reference to the embodiments of the present invention.

First Embodiment

Figure 1:
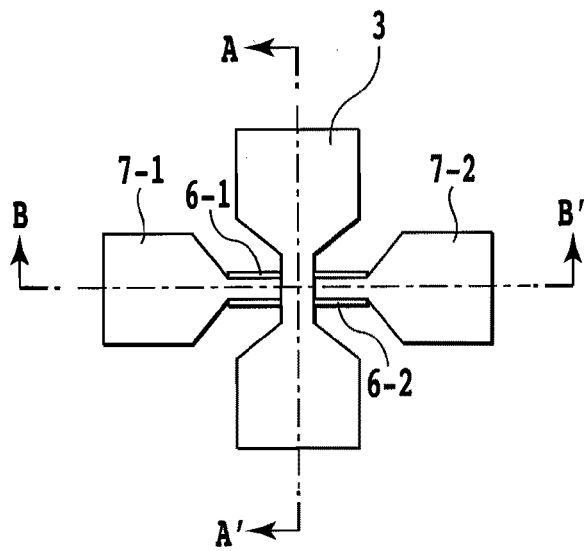
FIG. 1 is a plan view of a conventional fin (Fin) type double gate field-effect transistor structure.
Figure 2:
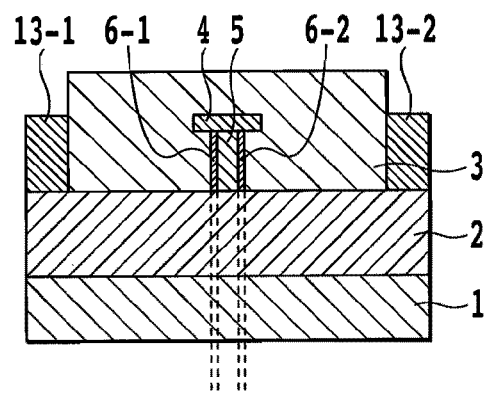
FIG. 2 is a A-A' sectional view of FIG. 1.
Figure 3:
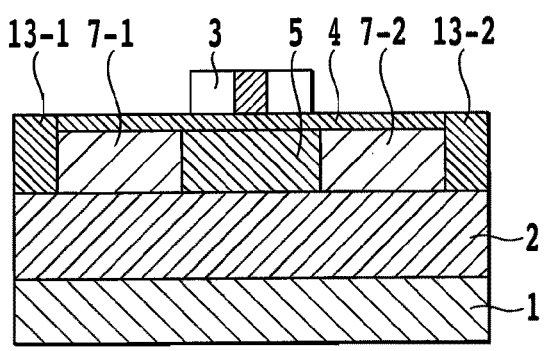
FIG. 3 is a B-B' sectional view of FIG. 1.
Figure 4:
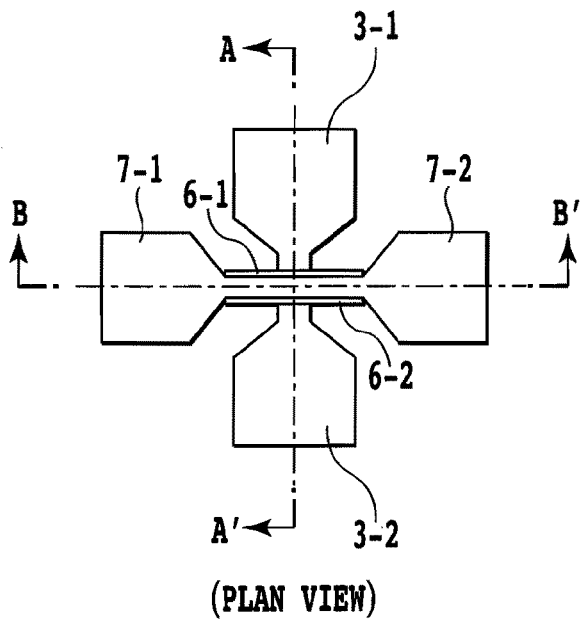
FIG. 4 is a plan view of a separate gate four terminal double gate field-effect transistor having a conventional symmetrical gate insulation film thickness.
Figure 5:
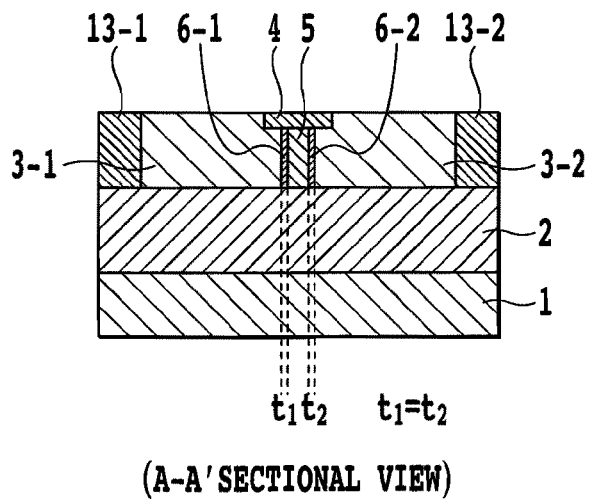
FIG. 5 is a A-A' sectional view of FIG. 4.
Figure 6:
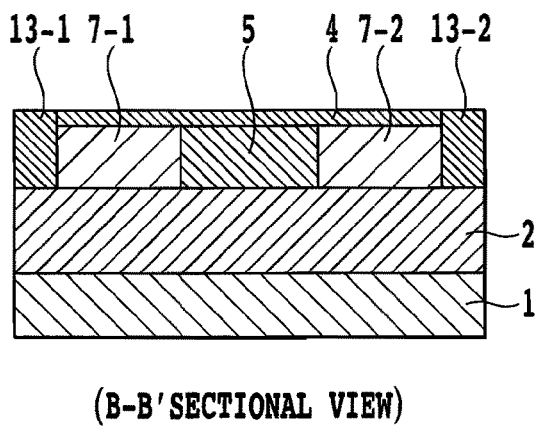
FIG. 6 is a B-B' sectional view of FIG. 4.
Figure 7:
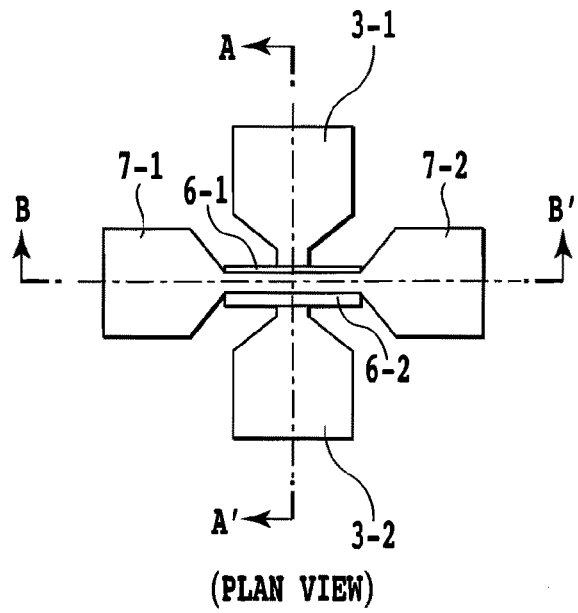
FIG. 7 is a plan view of a separate gate four terminal double gate field-effect transistor having a conventional asymmetrical gate insulation film thickness.
Figure 8:
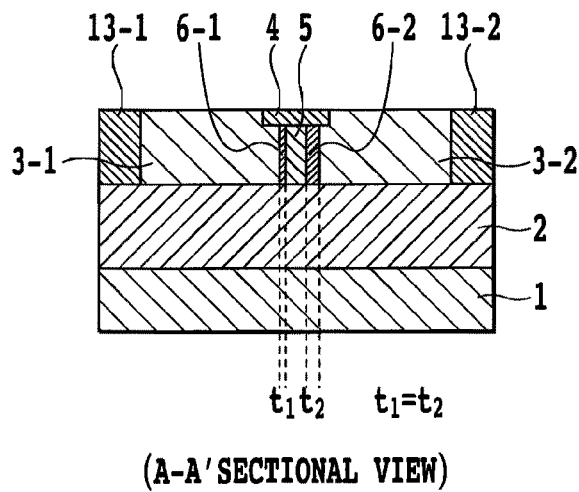
FIG. 8 is a A-A' sectional view of FIG. 7.
Figure 9:
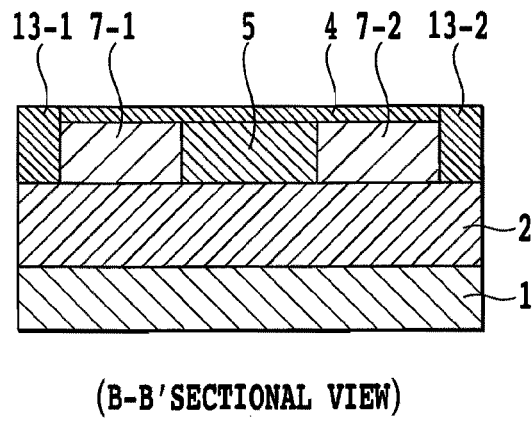
FIG. 9 is a B-B' sectional view of FIG. 7.
Figure 10:
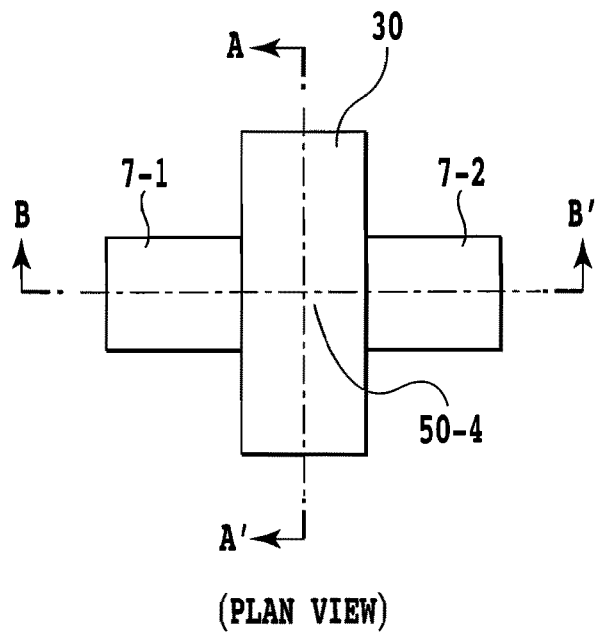
FIG. 10 is a plan view of a planer type field-effect transistor having a conventional movable gate electrode.
Figure 11:
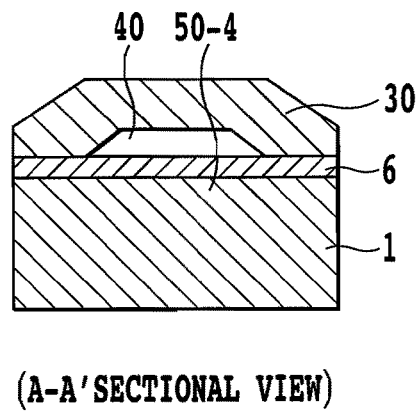
FIG. 11 is a A-A' sectional view of FIG. 10.
Figure 12:
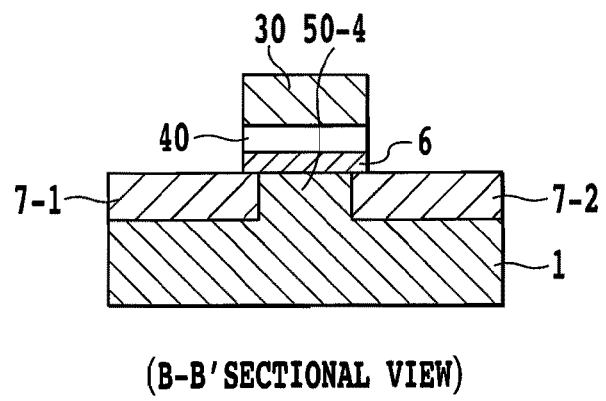
FIG. 12 is a B-B' sectional view of FIG. 10.
Figure 13:
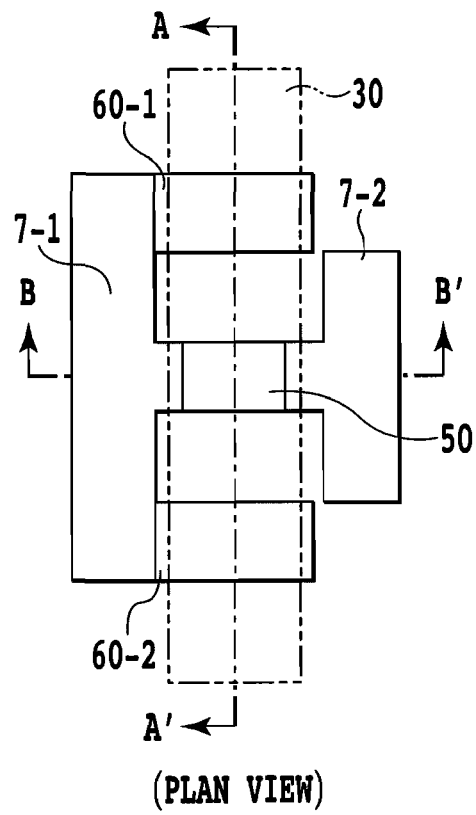
FIG. 13 is a plan view of a movable gate field-effect transistor with a triangle cross-sectional shape channel according to the first embodiment of the present invention.
Figure 14:
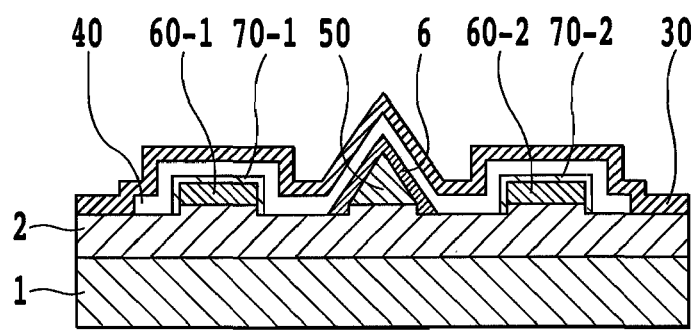
FIG. 14 is a A-A' sectional view of FIG. 13.
Figure 15:
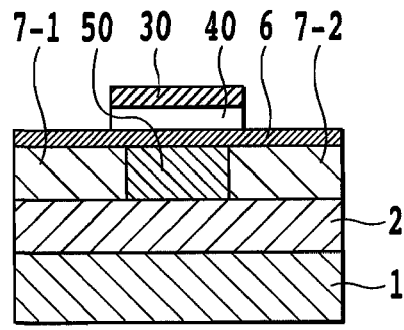
FIG. 15 is a B-B' sectional view of FIG. 13.

A first embodiment according to the present invention is illustrated in FIGS. 13 to 15. FIG. 13 is a plan view of a movable gate field-effect transistor formed on a (100) SOI substrate according to the present invention. FIG. 14 is an A-A' sectional view, and FIG. 15 is a B-B' sectional view. In FIGS. 13 to 15, reference numeral 1 denotes a substrate, reference numeral 2 denotes an embedded oxide film, reference numeral 30 denotes a movable gate electrode, reference numeral 50 denotes a channel region having a triangle cross-sectional shape formed in a part of a semiconductor crystal layer, reference numeral 6 denotes a gate insulation film, reference numerals 7-1 and 7-2 denote a source region and a drain region, respectively, reference numeral 40 denotes a gap formed by the etching of a sacrifice layer, reference numerals 60-1 and 60-2 denote fixed electrodes formed in parts of the semiconductor crystal layer, and reference numerals 70-1 and 70-2 denote insulation films.

Figure 16:
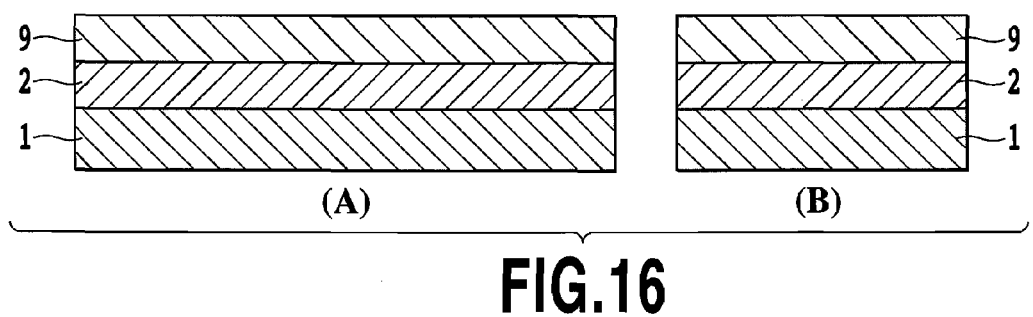
FIG. 16 is a graph showing the fabrication process of a movable gate field-effect transistor having a triangle cross-sectional shape channel according to the first embodiment of the present invention.

In FIGS. 16 to 33, illustrated is a manufacturing process example of the movable gate field-effect transistor according to the first embodiment of the present invention. First, as illustrated in FIG. 16, on a silicon substrate 1, prepared is a SOI (Silicon-On-Insulator) wafer comprising an embedded oxide film 2 and a silicon crystal layer 9 with the (100) orientation.

Figure 17:
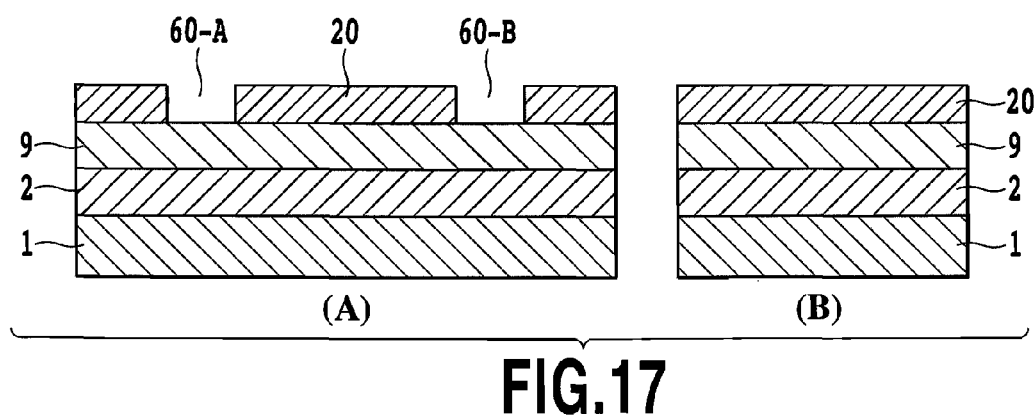
FIG. 17 is a graph showing the fabrication process of a movable gate field-effect transistor having a triangle cross-sectional shape channel according to the first embodiment of the present invention.

Then, as illustrated in FIG. 17, a resist 20 is coated on the wafer, and patterns of a fixed gate regions 60-A and 60-B are formed by an electron beam (Electron Beam: EB) lithography.

Figure 18:
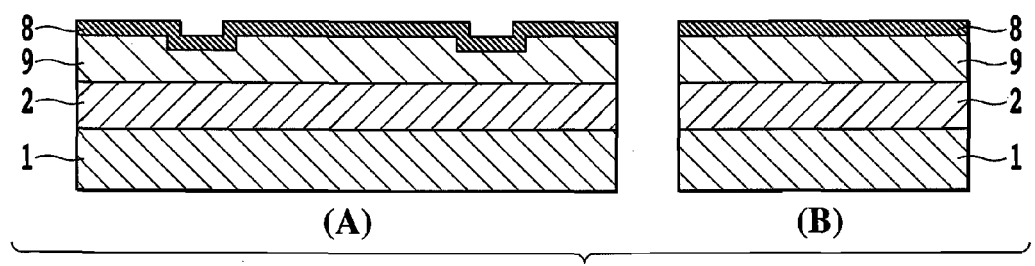
FIG. 18 is a graph showing the fabrication process of a movable gate field-effect transistor having a triangle cross-sectional shape channel according to the first embodiment of the present invention.

Then, as illustrated in FIG. 18, the SOI layer at the regions 60-A and 60-B is etched with the resist used as a mask by reactive-ion-etching (RIE) technology to form recess structures, and a thermal oxide film 8 is formed after the resist 20 is removed.

Figure 19:
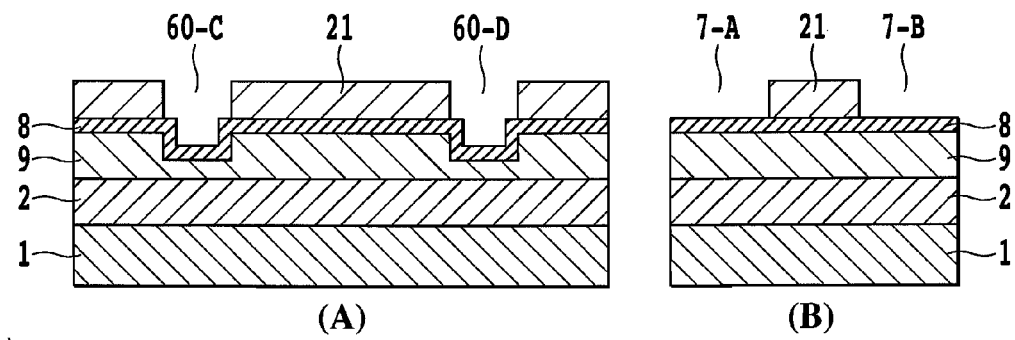
FIG. 19 is a graph showing the fabrication process of a movable gate field-effect transistor having a triangle cross-sectional shape channel according to the first embodiment of the present invention.

Then, as illustrated in FIG. 19, a resist 21 is coated on the wafer, and patterns of a fixed electrode regions 60-C and 60-D and patterns of source/drain regions 7-A and 7-B are formed by the EB lithography. Here, by forming the patterns of the fixed electrode regions 60-C and 60-D and the pattern of the source region 7-A with these patterns connected, these regions can be made to be at the same potential at the time of device operation. By forming separately the patterns of the fixed electrode regions 60-C and 60-D and the pattern of the source region 7-A without connecting them, the potential of the fixed electrode can also be controlled independently.

Figure 20:
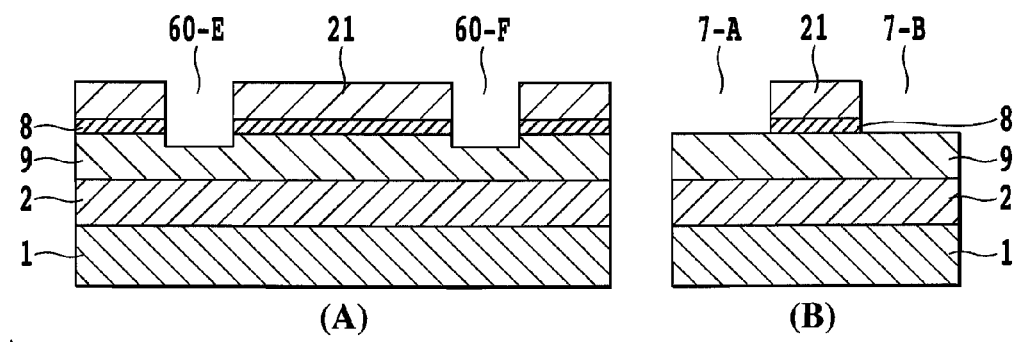
FIG. 20 is a graph showing the fabrication process of a movable gate field-effect transistor having a triangle cross-sectional shape channel according to the first embodiment of the present invention.

Then, as illustrated in FIG. 20, by utilizing the resist mask 21, the oxide film 8 on the fixed electrode regions 60-E and 60-F and on the source/drain regions 7-A and 7-B is etched by RIE.

Figure 21:
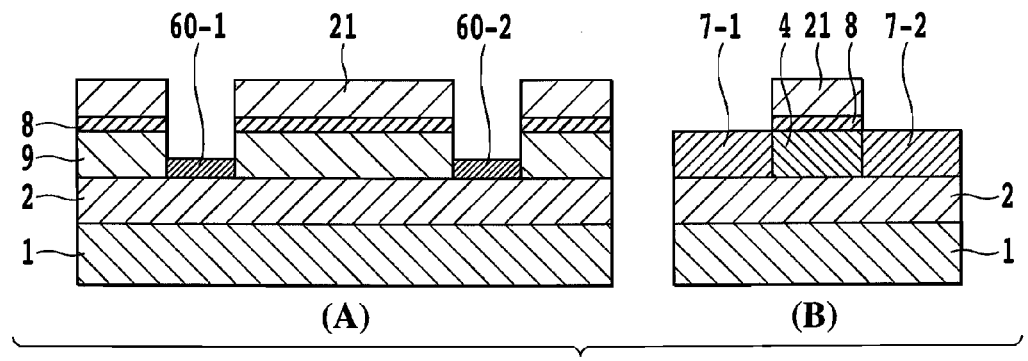
FIG. 21 is a graph showing the fabrication process of a movable gate field-effect transistor having a triangle cross-sectional shape channel according to the first embodiment of the present invention.

Then, as illustrated in FIG. 21, an ion implantation is carried out into fixed electrodes 60-1 and 60-2 and source/drain regions 7-1 and 7-2 to introduce impurities at high concentration. Thereby, a channel region 4 where impurities are not introduced and a source/drain region where impurities are introduced at high concentration are formed. After that, the resist 21 is removed with oxygen plasma, a sulfuric acid/hydrogen peroxide solution or the like.

Figure 22:
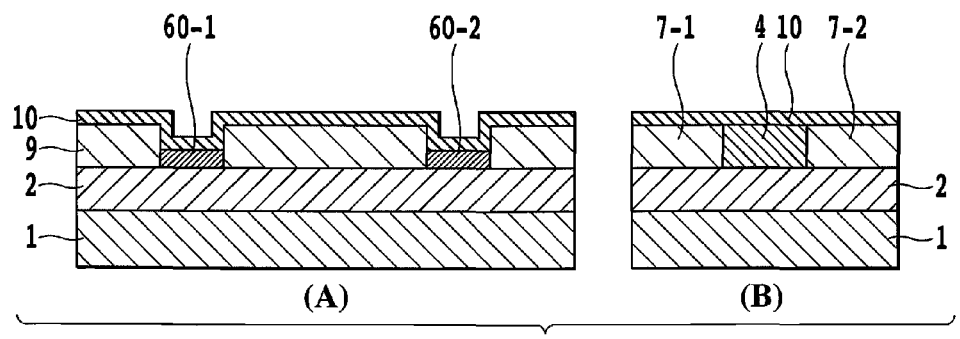
FIG. 22 is a graph showing the fabrication process of a movable gate field-effect transistor having a triangle cross-sectional shape channel according to the first embodiment of the present invention.

Then, as illustrated in FIG. 22, the wafer is cleaned after the thermal oxide film on the wafer is removed entirely, and a thermal oxide film 10 is newly formed on the entire wafer surface.

Figure 23:
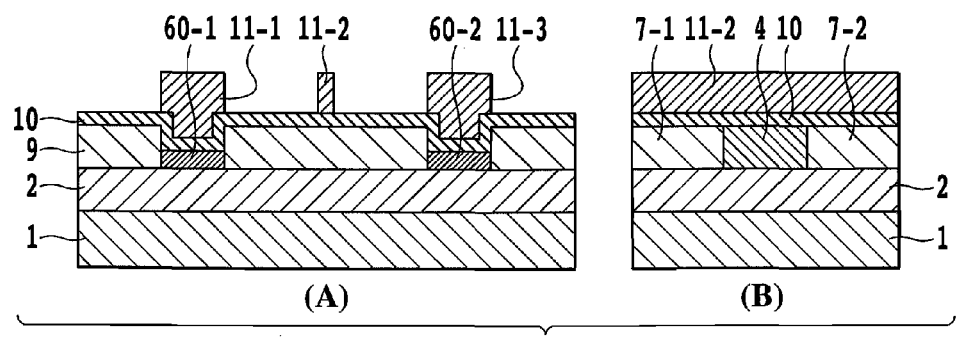
FIG. 23 is a graph showing the fabrication process of a movable gate field-effect transistor having a triangle cross-sectional shape channel according to the first embodiment of the present invention.

Then, as illustrated in FIG. 23, a resist is coated on the entire wafer surface, and a resist pattern 11-2 on the channel region and resist patterns 11-1 and 11-3 on the fixed electrodes 60-1 and 60-2 are formed by the EB lithography. Here, width control of the pattern on the channel region is important.

Figure 24:
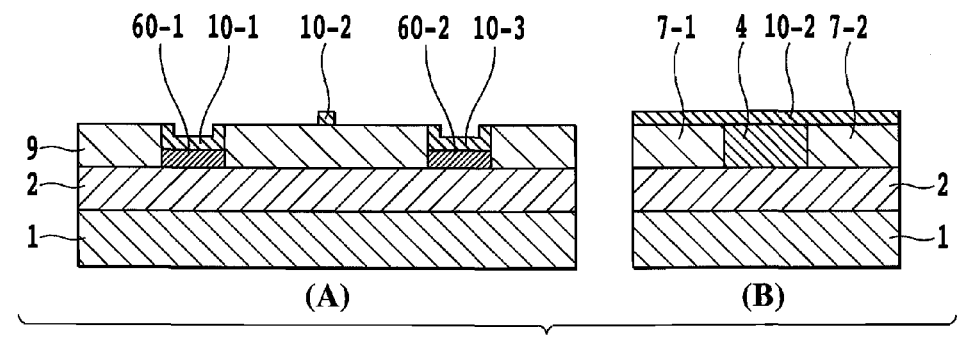
FIG. 24 is a graph showing the fabrication process of a movable gate field-effect transistor having a triangle cross-sectional shape channel according to the first embodiment of the present invention.

Then, as illustrated in FIG. 24, by using RIE, the oxide film 10 is partially etched to form a hard mask 10-2 on the channel region and hard masks 10-1 and 10-3 on the fixed electrode. Furthermore, by using diluted hydrofluoric acid (Diluted HF: DHF), width adjustment (narrowing adjustment) of the hard mask 10-2 on the channel region is carried out.

Figure 25:
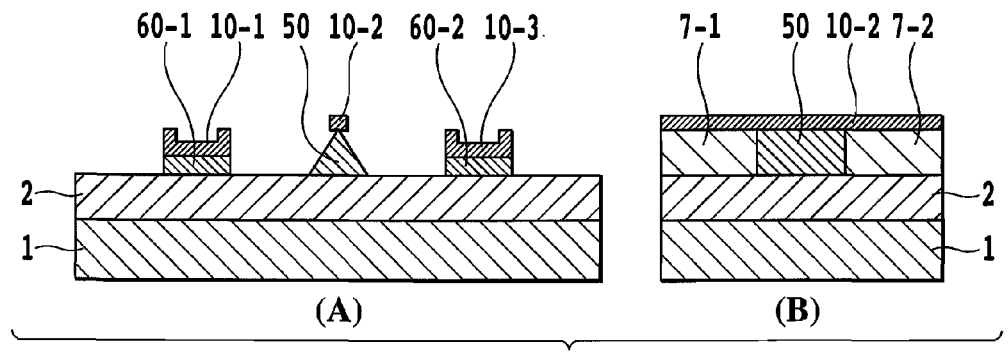
FIG. 25 is a graph showing the fabrication process of a movable gate field-effect transistor having a triangle cross-sectional shape channel according to the first embodiment of the present invention.

Then, as illustrated in FIG. 25, by using the hard masks 10-1, 10-2 and 10-3, crystal anisotropic etching of the SOI layer 9 is carried out by an aqueous alkali solution, for example, TMAH (Tetramethylammonium Hydroxide). Thereby, a lateral directional channel 50 having a triangle cross-sectional shape and the fixed electrodes 60-1 and 60-2 are formed. In this case, because both sides of the channel have the (111) orientation, the lateral directional channel having a triangle cross-sectional shape can be formed in a self-limiting fashion since the etching rate of the (111)-oriented plane in TMAH or the like is slower than other crystal planes. In this process, the fixed electrode regions 60-1 and 60-2 in which impurities are introduced at high concentration are formed at the same time. It is a characteristic feature that the height thereof is lower than that of the channel region 5.

Figure 26:
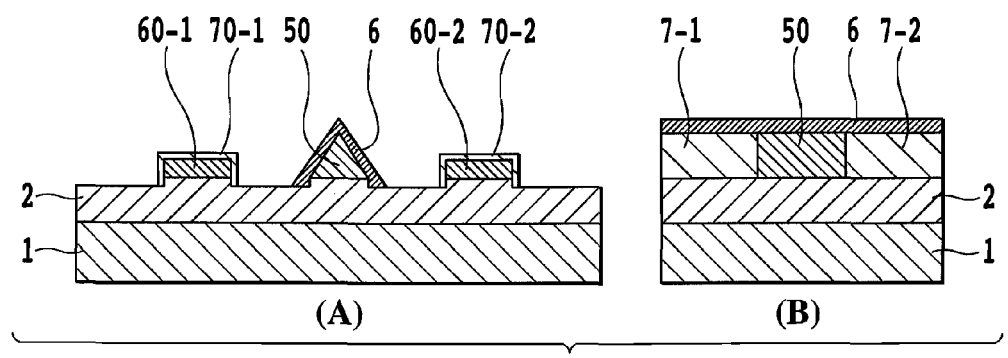
FIG. 26 is a graph showing the fabrication process of a movable gate field-effect transistor having a triangle cross-sectional shape channel according to the first embodiment of the present invention.

Then, as illustrated in FIG. 26, the hard masks 10-1, 10-2 and 10-3 are etched by hydrofluoric acid, and RCA cleaning of the wafer is carried out. Because the embedded oxide film 2 is also etched during this etching of the hard masks, the embedded oxide film outside the channel region and the fixed electrode regions becomes slightly thin. A thermal oxidation is carried out after the wafer cleaning. At this time, a gate oxide film 6, oxide films 70-1 and 70-2 on the fixed electrodes are formed. In the fixed gate regions, impurities have been doped at high concentration, and therefore the oxide films 70-1 and 70-2 are thicker than the gate oxide film 6.

Figure 27:
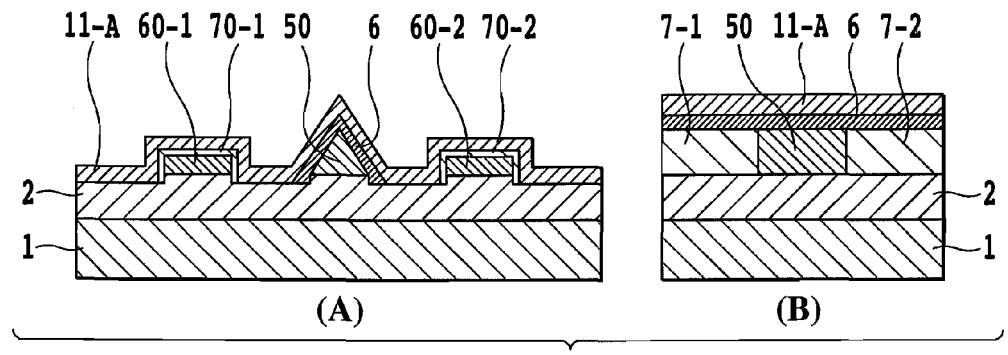
FIG. 27 is a graph showing the fabrication process of a movable gate field-effect transistor having a triangle cross-sectional shape channel according to the first embodiment of the present invention.

Then, as illustrated in FIG. 27, a sacrifice layer 11-A is deposited. As the sacrifice layer, polysilicon or the like is included. The film thickness control of the sacrifice layer is important. Afterwards, this film thickness becomes the gap between the movable gate electrode and the gate insulation film.

Figure 28:
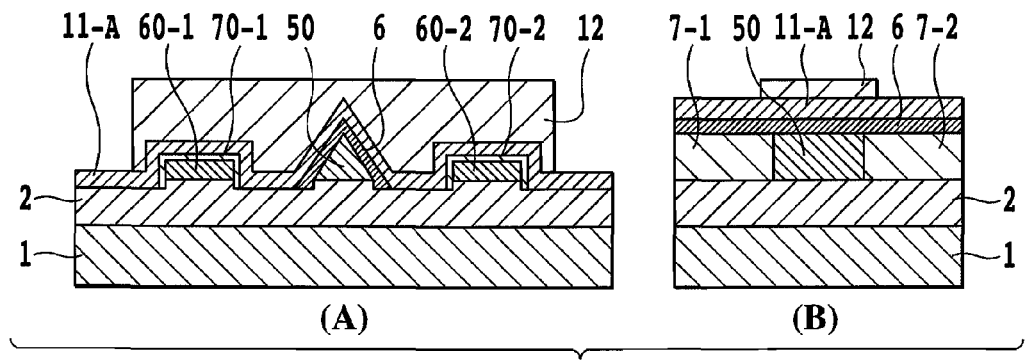
FIG. 28 is a graph showing the fabrication process of a movable gate field-effect transistor having a triangle cross-sectional shape channel according to the first embodiment of the present invention.

Then, as illustrated in FIG. 28, a resist is coated on the entire wafer surface, and a resist pattern 12 on the movable gate region and the fixed electrode regions is formed by EB lithography. In these regions, a negative resist is used because these regions will be left at a latter process step.

Figure 29:
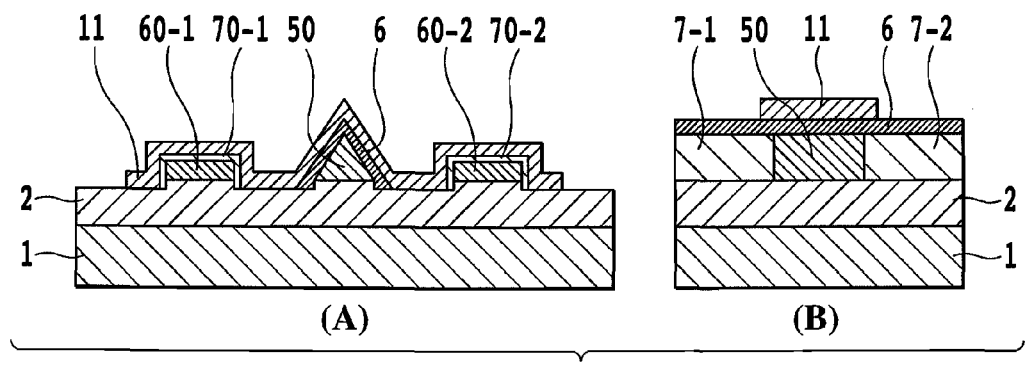
FIG. 29 is a graph showing the fabrication process of a movable gate field-effect transistor having a triangle cross-sectional shape channel according to the first embodiment of the present invention.

Then, as illustrated in FIG. 29, by using RIE, a sacrifice layer pattern 11 on the movable gate region and the fixed electrode regions is formed, and the resist is removed.

Figure 30:
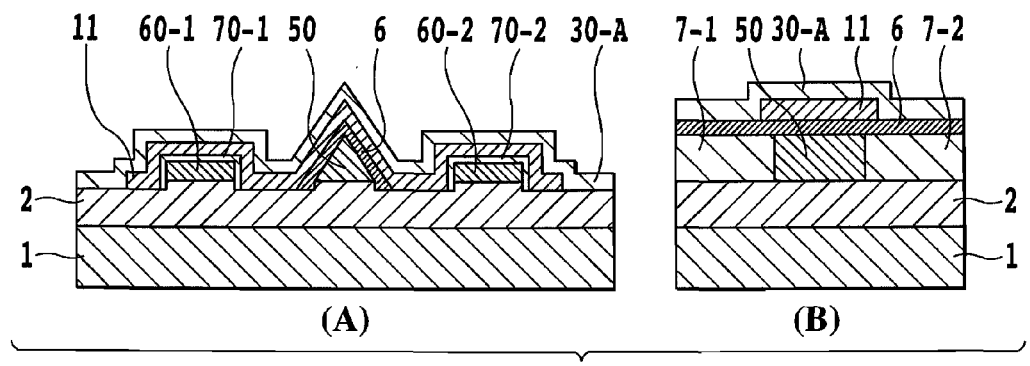
FIG. 30 is a graph showing the fabrication process of a movable gate field-effect transistor having a triangle cross-sectional shape channel according to the first embodiment of the present invention.

Then, as illustrated in FIG. 30, a gate electrode material 30-A is deposited. As the gate electrode material, because it operates mechanically as the movable gate electrode, it is desirable to adopt a material having a suitable spring constant and is different from the polysilicon sacrifice layer. Additionally, it is desirable that the etching selectivity ratio with respect to polysilicon is high. For example, MO, TiN or the like which are high melting point metal films are used.

Figure 31:
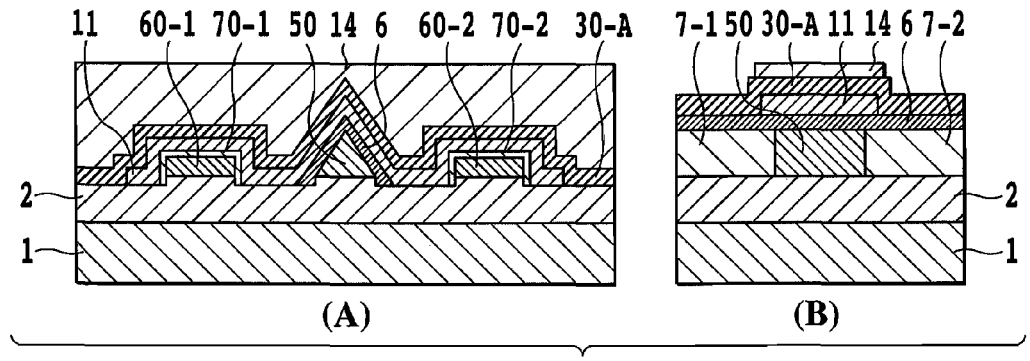
FIG. 31 is a graph showing the fabrication process of a movable gate field-effect transistor having a triangle cross-sectional shape channel according to the first embodiment of the present invention.

Then, as illustrated in FIG. 31, a pattern 14 of the movable gate electrode is formed by EB lithography. Also in this case, a negative resist is used because the movable gate electrode and the fixed electrodes will be left.

Figure 32:
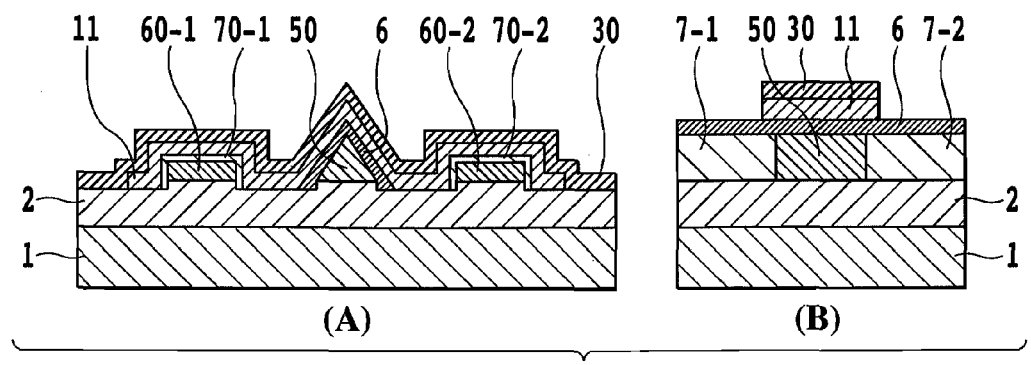
FIG. 32 is a graph showing the fabrication process of a movable gate field-effect transistor having a triangle cross-sectional shape channel according to the first embodiment of the present invention.

Then, as illustrated in FIG. 32, by using RIE, the gate electrode material is etched to form a movable gate electrode region 30, and the resist is removed.

Figure 33:
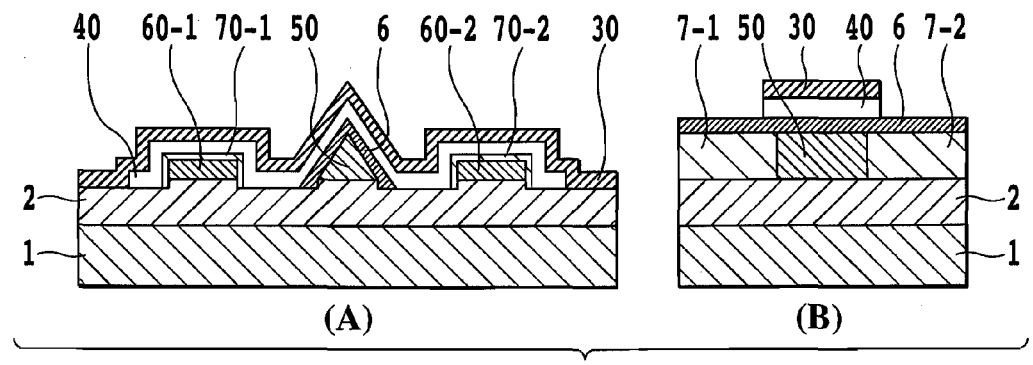
FIG. 33 is a graph showing the fabrication process of a movable gate field-effect transistor having a triangle cross-sectional shape channel according to the first embodiment of the present invention.

Then, an Al electrode is formed after a contact hole is formed. Since these processes are the same as the usual integrated-circuit fabricating processes, explanation thereof are not given herein. After that, as illustrated in FIG. 33, the sacrifice layer region is selectively opened, and the sacrifice layer is etched to thereby form the movable gate electrode 30 and a gap 40 between the gate insulation film 6 and the movable gate electrode 30.

Second Embodiment

Figure 34:
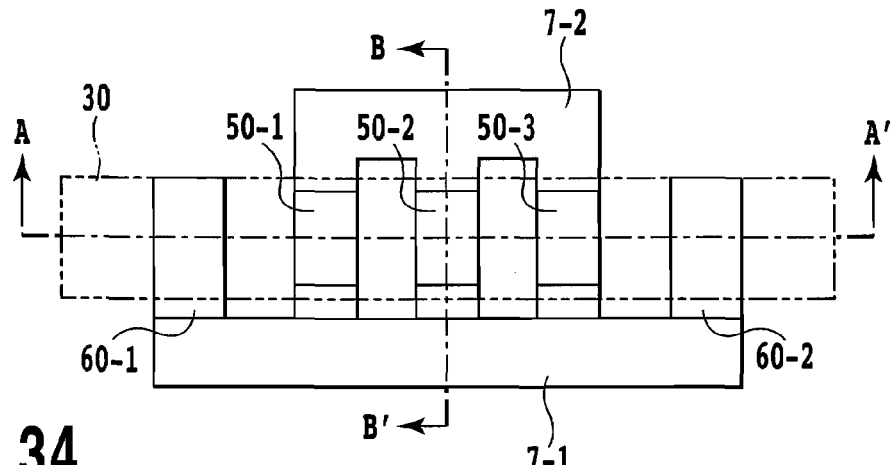
FIG. 34 is a plan view of a movable gate field-effect transistor with multi-channels (Multi-Channel) of triangle cross-sectional shape according to the second embodiment of the present invention.
Figure 35:
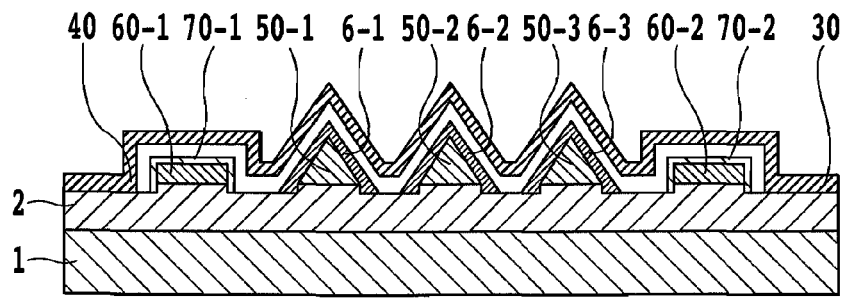
FIG. 35 is a A-A' sectional view of FIG. 34.
Figure 36:
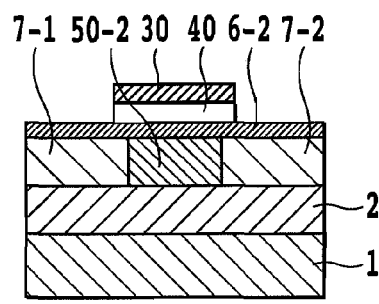
FIG. 36 is a B-B' sectional view of FIG. 34.

The second embodiment of the present invention is illustrated in FIGS. 34 to 36. FIG. 34 is a plan view of a multi-channel (Multi-Channel) movable gate field-effect transistor having a triangle cross-sectional shape according to the present invention. FIG. 35 is an A-A' sectional view, and FIG. 36 is a B-B' sectional view. In FIGS. 34 to 36, reference numeral 1 denotes a substrate, reference numeral 2 denotes an embedded oxide film, reference numeral 30 denotes a movable gate electrode, reference numeral 40 denotes the gap formed by etching a sacrifice layer, reference numerals 50-1, 50-2 and 50-3 denote multi-channels with triangle cross-sectional shape, reference numerals 6-1, 6-2 and 6-3 denote gate insulation films, reference numerals 60-1 and 60-2 denote fixed electrode regions formed with impurities introduced therein at high concentration, reference numerals 70-1 and 70-2 denote insulation films formed on the fixed electrodes, and reference numerals 7-1 and 7-2 denote source/drain regions.

The fabrication process of the second embodiment is basically the same as that of the first embodiment. A difference is that, at the time of the channel resist pattern formation by EB lithography in the above-mentioned paragraph 0021, multiple channel patterns are formed at the same time in stead of a single channel. Other processes are the same as those of the first embodiment.

Third Embodiment

A third embodiment of the present invention is illustrated in FIGS. 37 to 39. FIG. 37 is a plan view of a device with a thin film fixed gate electrode 80 and a movable gate electrode 30 according to the present invention. FIG. 38 is an A-A' sectional view, and FIG. 39 is a B-B' sectional view. In FIGS. 37 to 39, reference numeral 1 denotes a substrate, reference numeral 2 denotes an embedded oxide film, reference numeral 30 denotes the movable gate electrode, reference numeral 50 denotes a channel having a triangle cross-section shape, reference numeral 6 denotes a gate insulation film, reference numerals 70-1 and 70-2 denote insulation films formed on fixed electrodes, reference numerals 7-1 and 7-2 denote source/drain regions, reference numeral 40 denotes a gap formed by etching a sacrifice layer, reference numeral 80 denotes the thin film fixed gate electrode, and reference numerals 60-1 and 60-2 denote fixed electrodes formed with impurities introduced therein at high concentration. By appropriately selecting the work function of the thin film fixed gate electrode 80 and giving suitable potential thereto, it is possible to make the channel having a triangle cross-sectional shape be completely depleted when a voltage is not applied to the movable gate, that is, when the movable gate electrode is separated from the gate insulation film. Therefore, a leakage current from the movable gate can be made zero at the time of standby of the device, and at the same time, a leakage current between the source/drain can also be suppressed effectively.

The fabrication process of the third embodiment is basically the same as that of the first embodiment. A difference is as follows: after forming the gate oxide film 6 in the above-mentioned paragraph 0026, subsequently the material of the thin film fixed gate electrode 80 is deposited, and thereafter, the thin film fixed gate electrode 80 on the channel region is selectively formed by using EB lithography and RIE, and after the resist is removed, the processes subsequent to the above-mentioned paragraph 0027 are continued. Other processes are the same as those of the first embodiment.

Fourth Embodiment

The fourth embodiment of the present invention is illustrated in FIGS. 40 to 42. FIG. 40 illustrates a plan view of a movable gate field-effect transistor comprising multi-channels (Multi-Channel) of triangle cross-sectional shape and thin film fixed gate electrodes 80-1, 80-2 and 80-3 according to the present invention. FIG. 41 is an A-A' sectional view, and FIG. 42 is a B-B' sectional view. In FIGS. 40 to 42, reference numeral 1 denotes a substrate, reference numeral 2 denotes an embedded oxide film, reference numeral 30 denotes a movable gate electrode, reference numerals 50-1, 50-2 and 50-3 denote the multi-channels of triangle cross-sectional shape, reference numerals 6-1, 6-2 and 6-3 denote gate insulation films, reference numerals 70-1 and 70-2 denote insulation films formed on the fixed electrodes, reference numerals 7-1 and 7-2 denote source/drain regions, reference numeral 40 denotes the gap formed by etching a sacrifice layer, reference numerals 80-1, 80-2 and 80-3 denote the thin film fixed gate electrodes, and reference numerals 60-1 and 60-2 denote fixed electrodes formed with impurities introduced therein at high concentration.

The fabrication process of the fourth embodiment is basically the same as that of the first embodiment. Differences are the following two points. (1) At the time of the channel resist pattern formation by EB lithography in the above-mentioned 00013, multiple channel patterns are formed at the same time in stead of a single channel. (2) After forming the gate oxide film 6 in the above-mentioned paragraph 0024, subsequently the material of the thin film fixed gate electrode 80 is deposited, and thereafter, the thin film fixed gate electrodes 80-1, 80-2 and 80-3 on the multi-channel region is selectively formed by EB lithography and RIE, and after the resist is removed, the processes subsequent to the above-mentioned paragraph 0025 are continued. Other processes are the same as those of the first embodiment.

Fifth Embodiment

Figure 43:
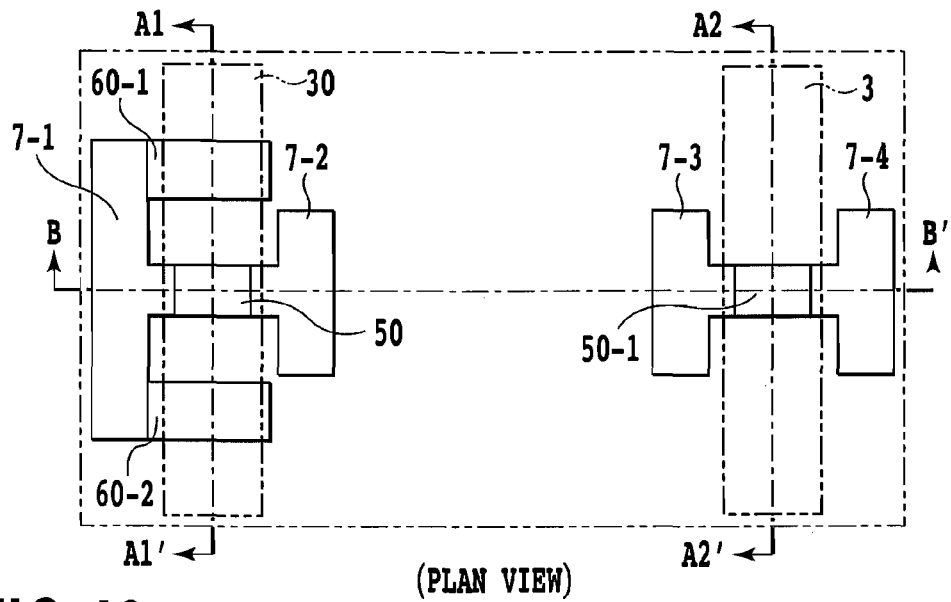
FIG. 43 is a plan view of an integrated circuit that co-integrates a movable gate field-effect transistor and a fixed double gate field-effect transistor, each of which having a triangle cross-sectional shape channel, according to the fifth embodiment of the present invention.
Figure 44:
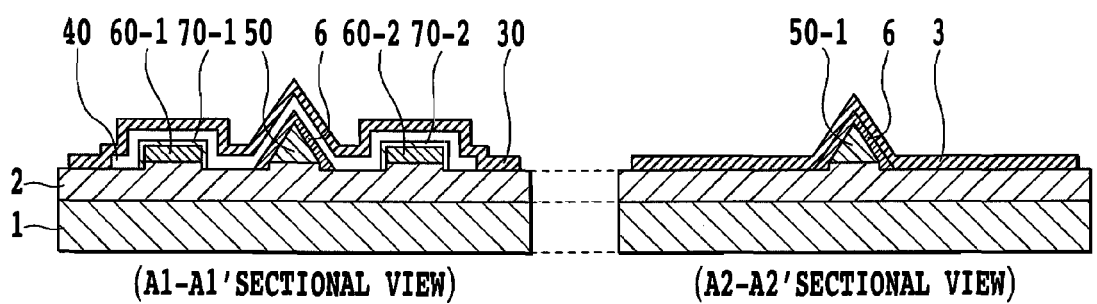
FIG. 44 is a A-A' sectional view of FIG. 43.
Figure 45:
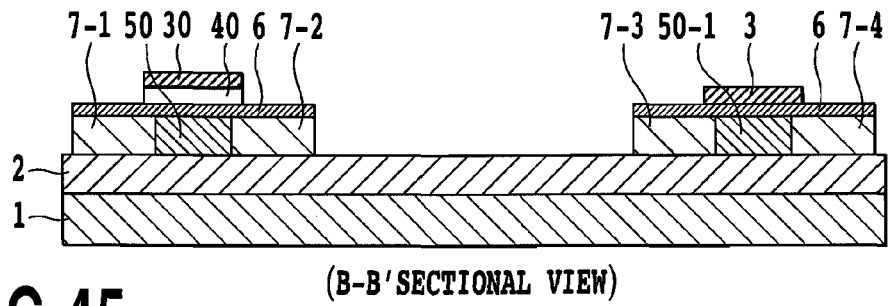
FIG. 45 is a B-B' sectional view of FIG. 43.

The fifth embodiment of the present invention is illustrated in FIGS. 43 to 45. FIG. 43 is a plan view of an integrated circuit that co-integrates a movable gate field-effect transistor with a triangle cross-sectional shape channel according to the present invention and a fixed double gate field-effect transistor with a triangle cross sectional shape channel. FIG. 44 is an A-A' sectional view, and FIG. 45 is a B-B' sectional view. In FIGS. 43 to 45, reference numeral 1 denotes a substrate, reference numeral 2 denotes an embedded oxide film, reference numeral 30 denotes a movable gate electrode, reference numeral 3 denotes a fixed gate electrode, reference numerals 50 and 50-1 denote channels of triangle cross-sectional shape, reference numeral 6 denotes a gate insulation film, reference numerals 70-1 and 70-2 denote insulation films formed on fixed electrodes, reference numerals 7-1, 7-2, 7-3 and 7-4 denote source/drain regions, reference numeral 40 denotes a gap formed by etching a sacrifice layer, and reference numerals 60-1 and 60-2 denote fixed electrodes formed with impurities introduced therein at high concentration.

The fabrication process of the fifth embodiment is basically the same as that of the first embodiment. Differences are the following two points. (1) At time of EB Lithography in above-mentioned paragraph 0028, the resist pattern is selectively formed only on the movable gate electrode region, but the resist is not covered on the fixed gate region, and then the sacrifice layer patterning by RIE depicted in paragraph 0029 is carried out. That is, the sacrifice layer on the fixed gate electrode region is etched and removed. (2) At the time of the sacrifice layer region being opened selectively as depicted in above-mentioned paragraph 0031, only the movable gate region is selectively opened to etch the sacrifice layer. Thereby, completed is the fabrication of the integrated circuit that co-integrates the triangle cross-sectional channel double gate field-effect transistor having the movable gate and the fixed gate according to the present invention.

Sixth Embodiment

Figure 46:
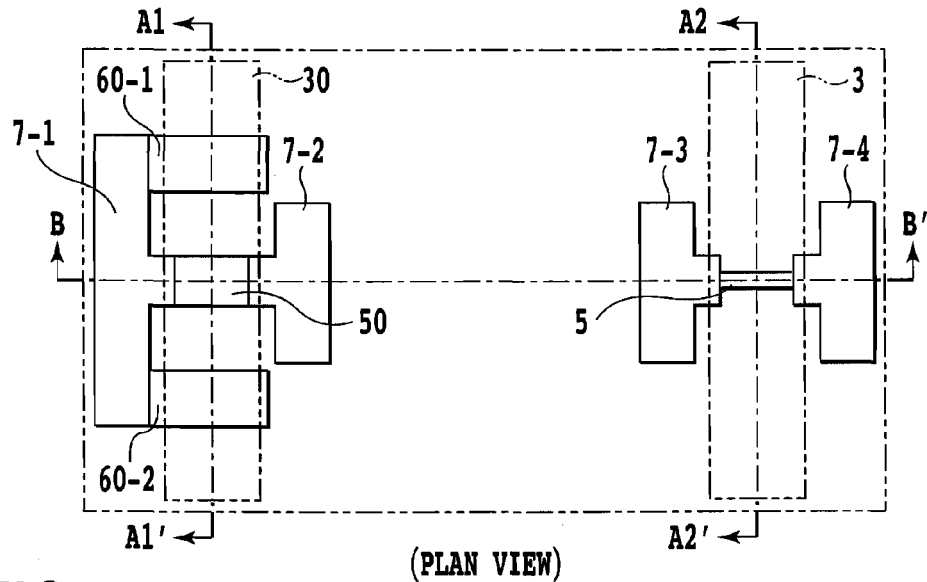
FIG. 46 is a plan view of an integrated circuit that co-integrates a movable gate field-effect transistor having a triangle cross-sectional shape channel and a fixed double gate field-effect transistor having a rectangle cross-sectional shape (Fin type) channel according to the sixth embodiment of the present invention.
Figure 47:
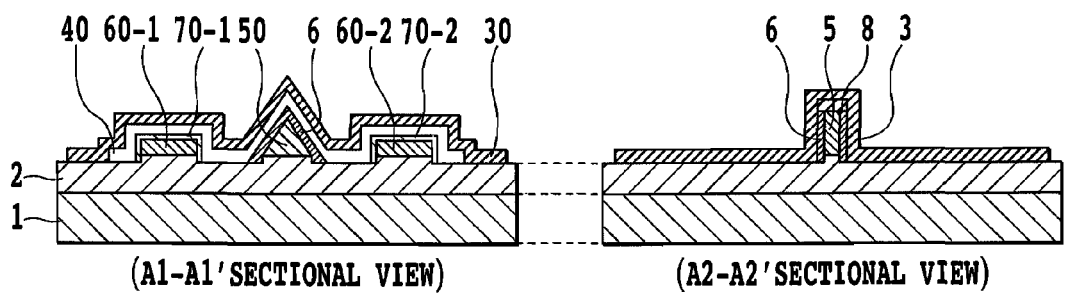
FIG. 47 is a A-A' sectional view of FIG. 46.
Figure 48:
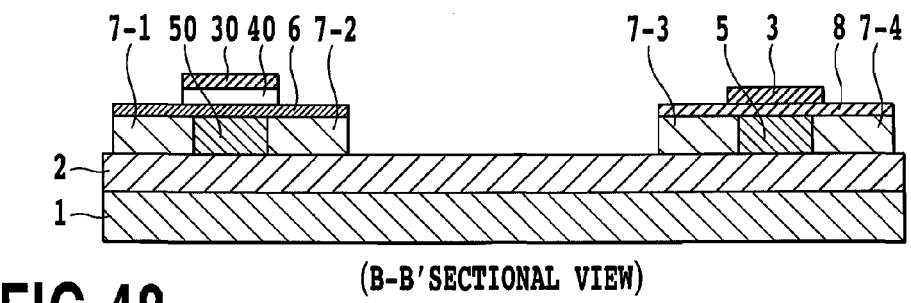
FIG. 48 is a B-B' sectional view of FIG. 46.

The sixth embodiment of the present invention is illustrated in FIGS. 46 to 48. FIG. 46 illustrates a plan view of an integrated circuit that co-integrates a movable gate field-effect transistor with a triangle cross-sectional shape according to the present invention and a fixed double gate field-effect transistor with a rectangle cross-sectional shape. FIG. 47 is an A-A' sectional view, and FIG. 48 is a B-B' sectional view. In FIGS. 46 to 48, reference numeral 1 denotes a substrate, reference numeral 2 denotes an embedded oxide film, reference numeral 8 denotes an insulation film, reference numeral 30 denotes a movable gate electrode, reference numeral 3 denotes a fixed gate electrode, reference numeral 50 denotes a channel of triangle cross-sectional shape, reference numeral 5 denotes a channel of rectangle cross-sectional shape (Fin type channel), reference numeral 6 denotes a gate insulation film, reference numerals 70-1 and 70-3 denote insulation films formed on the fixed electrodes, reference numerals 7-1, 7-2, 7-3 and 7-4 denote source/drain regions, reference numeral 40 denotes a gap formed by etching a sacrifice layer, and reference numerals 60-1 and 60-2 denote fixed electrodes formed with impurities introduced therein at high concentration.

The fabrication process of the sixth embodiment is basically the same as that of the first embodiment. Differences are the following three points. (1) After a hard mask forming process on the channel region depicted in above-mentioned paragraph 0024 is completed, a triangle cross-sectional shape channel region is protected by a resist in advance, and by carrying out SOI-etching by RIE, the channel (Fin type channel) of rectangular shape is formed. After that, the resist is removed, and the rectangle cross-sectional shape channel region is protected selectively by the resist, and then, the channel of triangle cross-sectional shape is formed by the crystal anisotropic etching depicted in the paragraph 0025. (2) At the time of carrying out EB lithography in the above-mentioned paragraph 0028, the resist pattern is selectively formed only on the movable gate electrode region, and the resist is not covered on the fixed gate region, and the sacrifice layer patterning by RIE depicted in the paragraph 0029 is carried out. That is, the sacrifice layer on the fixed gate electrode region is etched and removed. (3) When the sacrifice layer region is opened selectively as depicted in the above-mentioned paragraph 0031, only the movable gate region is opened selectively to etch the sacrifice layer. Thereby, completed is the manufacturing of the integrated circuit that co-integrates a triangle cross-sectional channel field-effect transistor having the movable gate according to the present invention and the double gate field-effect transistor having the rectangle cross-sectional shape channel.

Seventh Embodiment

Figure 49:
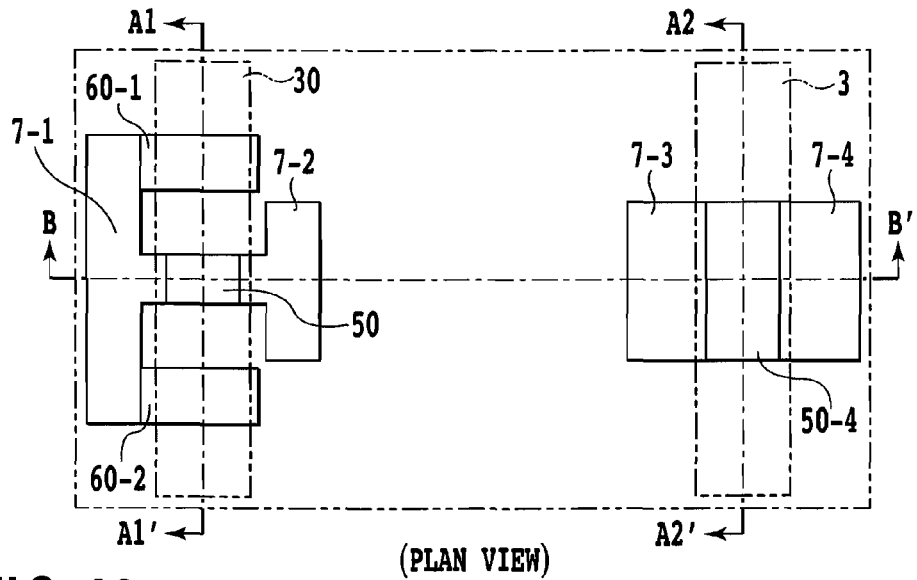
FIG. 49 is a plan view of an integrated circuit that co-integrates a movable gate field-effect transistor having a triangle cross-sectional shape channel and a planer type field-effect transistor having a conventional fixed gate electrode according to the seventh embodiment of the present invention.
Figure 50:
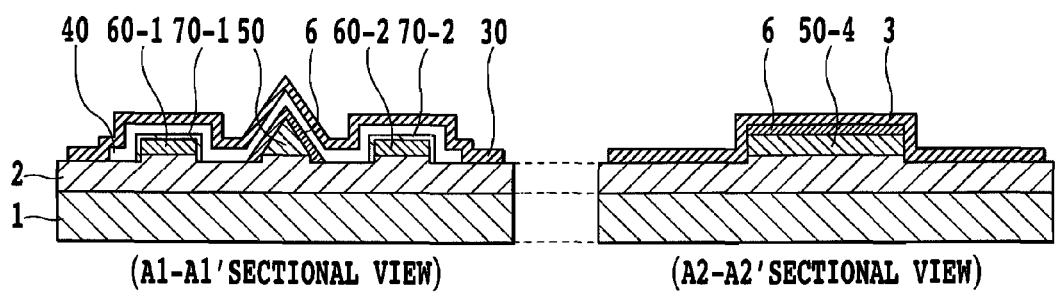
FIG. 50 is a A-A' sectional view of FIG. 49.
Figure 51:
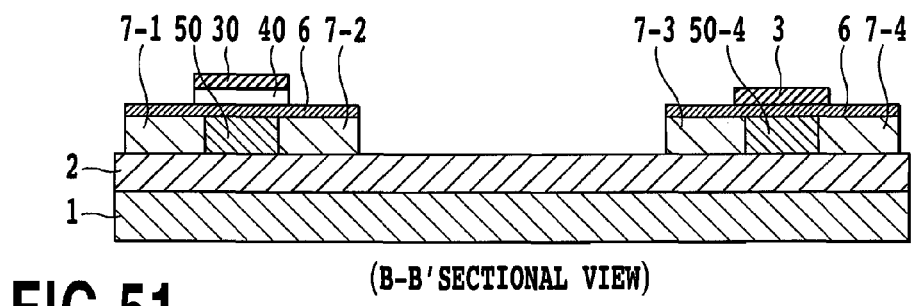
FIG. 51 is a B-B' sectional view of FIG. 49.

The seventh embodiment of the present invention is illustrated in FIGS. 49 to 51. FIG. 49 is a plan view of an integrated circuit that co-integrates a movable gate field-effect transistor of triangle cross-sectional shape according to the present invention and a conventional planer field-effect transistor. FIG. 50 is an A-A' sectional view, and FIG. 51 is a B-B' sectional view. In FIGS. 49 to 51, reference numeral 1 denotes a substrate, reference numeral 2 denotes an embedded oxide film, reference numeral 30 denotes a movable gate electrode, reference numeral 3 denotes a fixed gate electrode, reference numeral 50 denotes a channel of triangle cross-sectional shape, reference numeral 50-4 denotes a planer channel, reference numeral 6 denotes a gate insulation film, reference numerals 70-1 and 70-2 denote insulation films formed on the fixed electrodes, reference numerals 7-1, 7-2, 7-3 and 7-4 denote source/drain regions, reference numeral 40 denotes a gap formed by etching a sacrifice layer, and reference numerals 60-1 and 60-2 denote fixed electrodes formed with impurities introduced therein at high concentration.

The fabrication process of the seventh embodiment is basically the same as that of the first embodiment. Differences are the following three points. (1) After a hard mask forming process on the channel region depicted in above-mentioned paragraph 0024 is completed, a triangle cross-sectional shape channel region is protected by a resist in advance, and the planer channel is formed by carrying out SOI-etching by RIE. The hard mask on the region is removed, and the resist on the wafer is removed. After that, the planer channel region is selectively protected by a resist and then, the channel of triangle cross-sectional shape is formed by the crystal anisotropic etching depicted in the paragraph ]0025. (2) At the time of carrying out EB lithography in the above-mentioned paragraph 0028, the resist pattern is selectively kept only on the movable gate electrode region, and the resist is not kept on the fixed gate region (planer MOSFET region), and the sacrifice layer patterning by RIE depicted in the paragraph 0029 is carried out. That is, the sacrifice layer on the fixed gate electrode region is etched and removed. (3) When the sacrifice layer region is opened selectively as depicted in the above-mentioned paragraph 0031, only the movable gate region is selectively opened to etch the sacrifice layer. Thereby, completed is the manufacturing of the integrated circuit that co-integrates the movable gate field-effect transistor having the triangle cross-sectional shape channel according to the present invention and the planer field-effect transistor.

Eighth Embodiment

Figure 52:
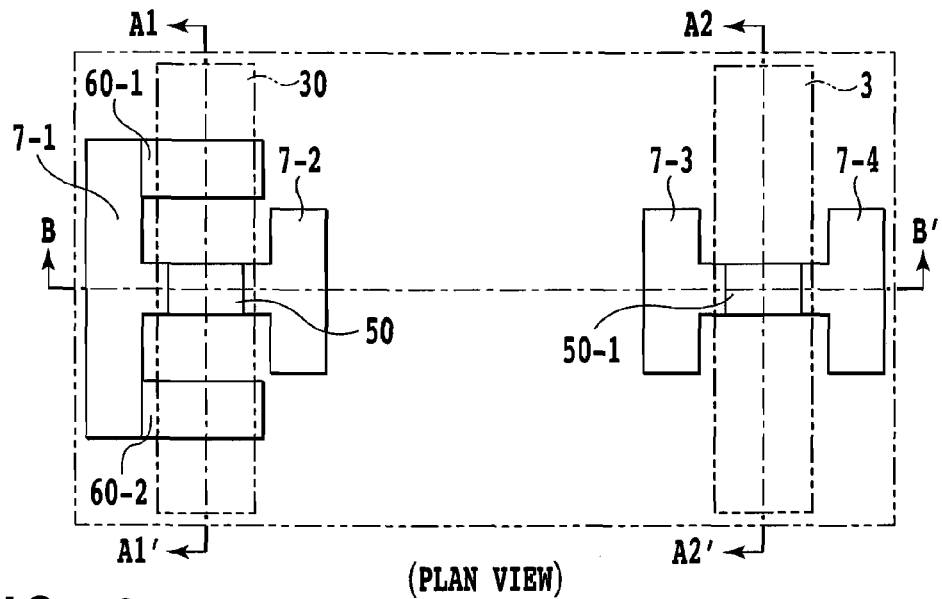
FIG. 52 is a plan view of an integrated circuit that co-integrates a movable gate field-effect transistor and a fixed double gate field-effect transistor, each of which having a triangle cross-sectional shape channel and a thin film fixed gate electrode, according to the eighth embodiment of the present invention.
Figure 53:
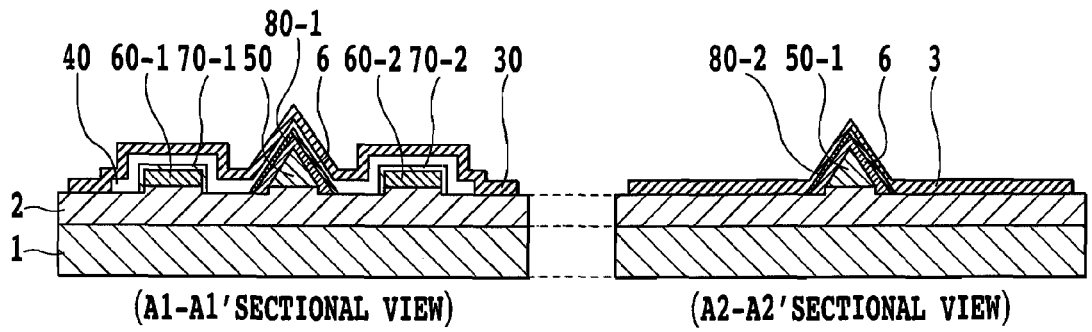
FIG. 53 is a A-A' sectional view of FIG. 52.
Figure 54:
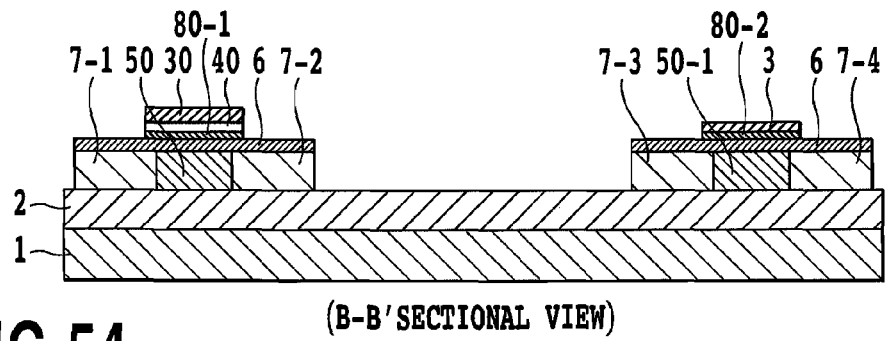
FIG. 54 is a B-B' sectional view of FIG. 52.

The eighth embodiment of the present invention is illustrated in FIGS. 52 to 54. FIG. 52 is a plan view of an integrated circuit that co-integrates a movable gate field-effect transistor and a fixed double gate field-effect transistor, each of which having a triangle cross-sectional shape channel and a thin film fixed gate electrode according to the present invention. FIG. 53 is an A-A' sectional view, and FIG. 54 is a B-B' sectional view. In FIGS. 52 to 54, reference numeral 1 denotes a substrate, reference numeral 2 denotes an embedded oxide film, reference numeral 30 denotes a movable gate electrode, reference numeral 3 denotes a fixed gate electrode, reference numerals 50 and 50-1 denote channels of triangle cross-sectional shape, reference numeral 6 denotes a gate insulation film, reference numerals 70-1 and 70-2 denote insulation films formed on the fixed electrodes, reference numerals 7-1, 7-2, 7-3 and 7-4 denote source/drain regions, reference numeral 40 denotes a gap formed by etching a sacrifice layer, reference numerals 80-1 and 80-2 denote thin film fixed gate electrodes, and reference numerals 60-1 and 60-2 denote fixed electrodes formed with impurities introduced therein at high concentration.

The fabrication process of the eighth embodiment is basically the same as that of the first embodiment. Differences are the following three points. (1) After the gate oxide film is formed as depicted in the above-mentioned paragraph 0026, subsequently the thin film fixed gate electrode material is deposited, and thereafter, the thin film fixed gate electrodes 80-1 and 80-2 on the channel regions are selectively formed by EB lithography and RIE, and then, the resist is removed. (2) At the time of the sacrifice layer pattern formation in the above-mentioned paragraph 0028, a resist pattern is formed only on the movable gate electrode region, and a resist pattern is not formed on the fixed gate electrode region. (3) When the sacrifice layer region is opened selectively as depicted in the above-mentioned paragraph 0031, only the movable gate region is selectively opened to etch the sacrifice layer. Thereby, completed is the fabrication of the integrated circuit that co-integrates a movable gate field-effect transistor and a fixed double gate field-effect transistor, each of which having a triangle cross-sectional shape channel and a thin film fixed gate material according to the present invention.

Ninth Embodiment

Figure 55:
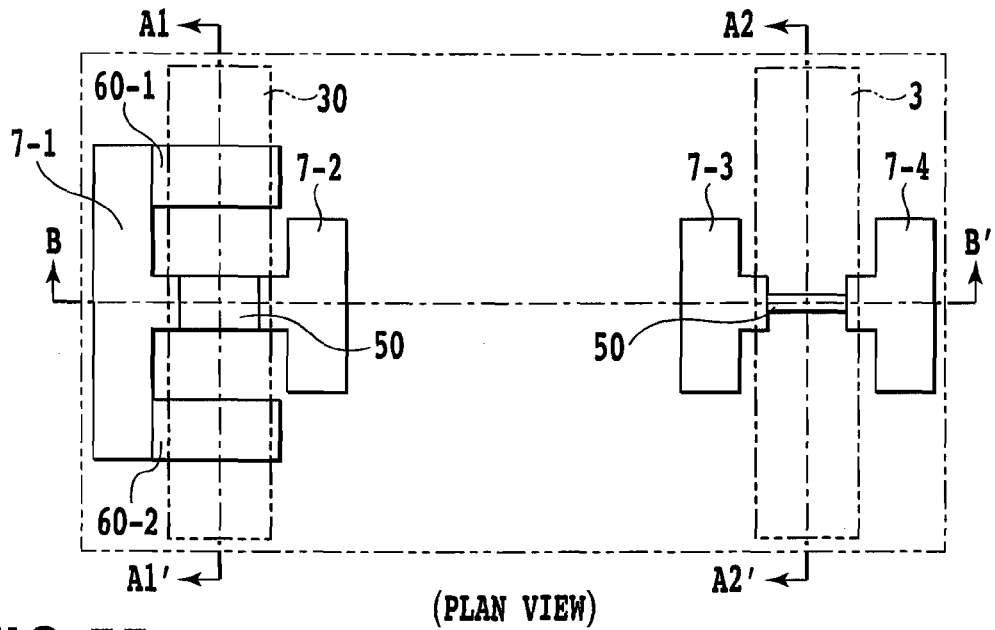
FIG. 55 is a plan view of an integrated circuit that co-integrates a movable gate field-effect transistor having a triangle cross-sectional shape channel and a fixed double gate field-effect transistor having a rectangle cross-sectional shape (Fin type) channel, each of which provided with a thin film fixed gate electrode, according to the ninth embodiment of the present invention.
Figure 56:
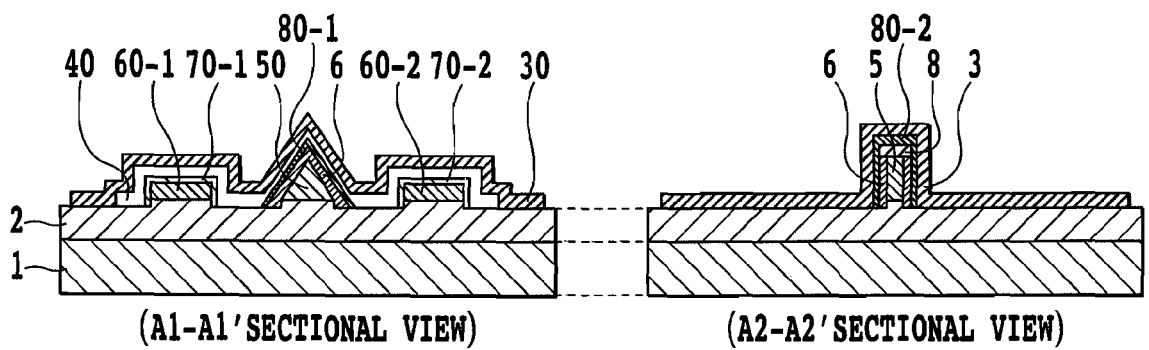
FIG. 56 is an A-A' sectional view of FIG. 55.
Figure 57:
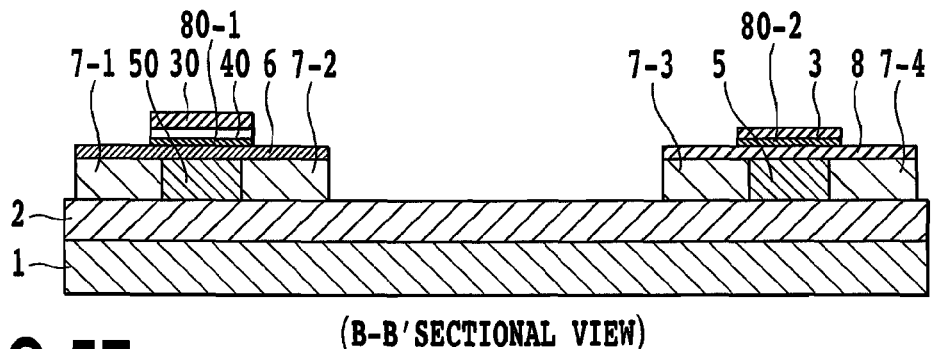
FIG. 57 is a B-B' sectional view of FIG. 55.

The ninth embodiment of the present invention is illustrated in FIGS. 55 to 57. FIG. 55 is a plan view of an integrated circuit that consolidates a movable gate field-effect transistor with a triangle cross-sectional shape channel and a fixed double gate field-effect transistor with a rectangular cross sectional shape, each of which provided with a thin film fixed gate material, according to the present invention. FIG. 56 is an A-A' sectional view, and FIG. 57 is a B-B'sectional view. In FIGS. 55 to 57, reference numeral 1 denotes a substrate, reference numeral 2 denotes an embedded oxide film, reference numeral 30 denotes a movable gate electrode, reference numeral 3 denotes a fixed gate electrode, reference numeral 50 denotes a channel having a triangle cross-sectional shape, reference numeral 5 denotes a rectangle cross-sectional shape channel, reference numeral 6 denotes a gate insulation film, reference numerals 70-1 and 70-2 denote insulation films formed on the fixed electrodes, reference numerals 7-1, 7-2, 7-3 and 7-4 denote source/drain regions, reference numeral 40 denotes a gap formed by etching a sacrifice layer, reference numerals 80-1 and 80-2 denote thin film fixed gate electrodes, and reference numerals 60-1 and 60-2 denote fixed electrode regions formed with impurities introduced therein at high concentration.

The fabrication process of the ninth embodiment is basically the same as that of the first embodiment. Differences are the following four points. (1) After a hard mask forming process on the channel regions depicted in the above-mentioned paragraph 0024 is completed, a triangle cross-sectional shape channel region is protected by the resist in advance, and the channel having the rectangular shape is formed by carrying out SOI-etching by RIE. After that, the resist is removed, and the rectangle cross-sectional shape channel region is selectively protected by a resist, and the channel having the triangle cross-sectional shape is formed by the crystal anisotropic etching depicted in the paragraph 0025. (2) After the gate oxide film is formed as depicted in the above-mentioned paragraph 0026, subsequently the thin film fixed gate electrode material is deposited, and thereafter, the thin film fixed gate electrodes 80-1 and 80-2 on the channel regions are selectively formed by EB lithography and RIE, and then, the resist is removed. (3) At the time of the sacrifice layer pattern formation in the above-mentioned paragraph 0028, a resist pattern is formed only on the movable gate electrode region, and a resist pattern is not formed on the fixed gate electrode region. (4) When the sacrifice layer region is opened selectively as depicted in the above-mentioned paragraph 0031, only the movable gate region is selectively opened to etch the sacrifice layer. Thereby, completed is the fabrication of the integrated circuit that co-integrates a movable gate field-effect transistor having a triangle cross-sectional shape channel and a fixed double gate field-effect transistor having a rectangle cross-sectional shape channel, each of which provided with a thin film fixed gate electrode according to the present invention.

Tenth Embodiment

Figure 58:
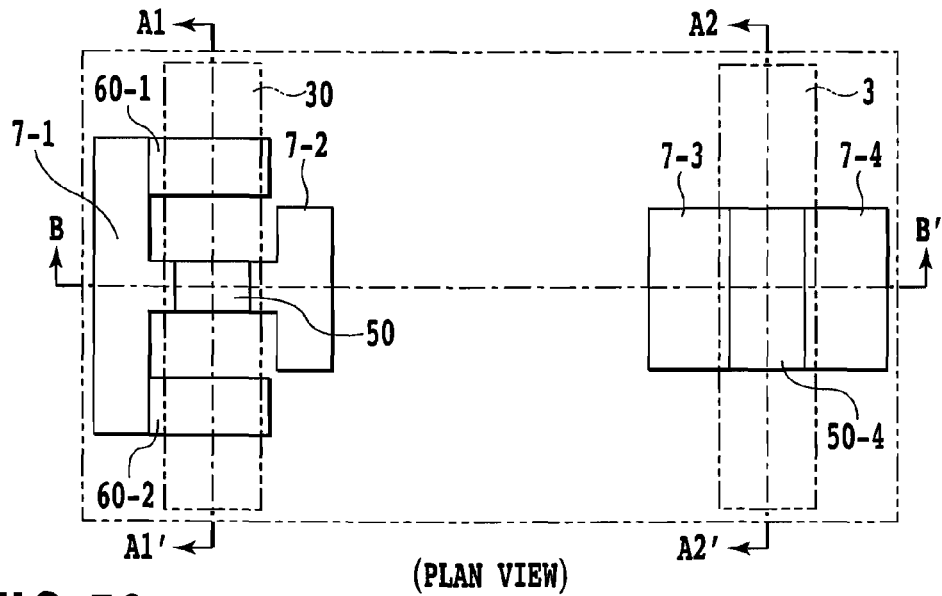
FIG. 58 is a plan view of an integrated circuit that co-integrates a movable gate field-effect transistor having a triangle cross-sectional shape and a conventional planer field-effect transistor having a conventional fixed gate electrode, each of which provided with a thin film fixed gate electrode, according to the tenth embodiment of the present invention.
Figure 59:
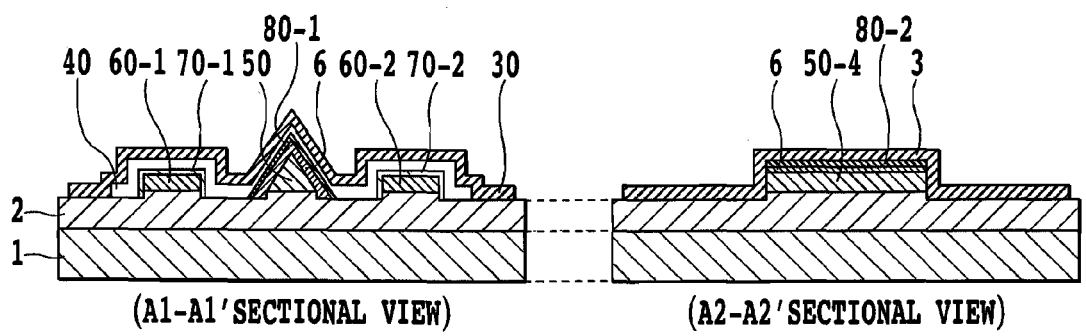
FIG. 59 is an A-A' sectional view of FIG. 58.
Figure 60:
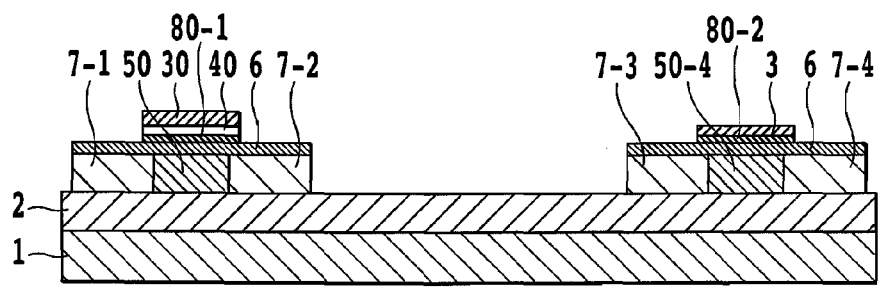
FIG. 60 is a B-B' sectional view of FIG. 58.

The tenth embodiment of the present invention is illustrated in FIGS. 58 to 60. FIG. 58 is a plan view of an integrated circuit which co-integrates a movable gate field-effect transistor of triangle cross-sectional shape with a thin film fixed gate electrode according to the present invention and a conventional planer field-effect transistor. FIG. 59 is an A-A' sectional view, and FIG. 60 is a B-B'sectional view. In FIGS. 58 to 60, reference numeral 1 denotes a substrate, reference numeral 2 denotes an embedded oxide film, reference numeral 30 denotes a movable gate electrode, reference numeral 3 denotes a fixed gate electrode, reference numeral 50 denotes a channel of triangle cross-sectional shape, reference numeral 50-4 denotes a planer channel, reference numeral 6 denotes a gate insulation film, reference numerals 70-1 and 70-2 denote insulation films formed on the fixed electrodes, reference numerals 7-1, 7-2, 7-3 and 7-4 denote source/drain regions, reference numeral 40 denotes a gap formed by etching a sacrifice layer, reference numerals 80-1 and 80-2 denote thin film fixed gate electrodes, and reference numerals 60-1 and 60-2 denote fixed electrodes formed with impurities introduced therein at high concentration.

The fabrication process of the tenth embodiment is basically the same as that of the first embodiment. Differences are the following four points. (1) After a hard mask forming process on the channel region depicted in the above-mentioned paragraph 0024 is completed, a triangle cross-sectional shape channel region is protected by a resist in advance, and the channel having the planer shape is formed by carrying out SOI-etching by RIE, and the hard mask on the region is removed. After that, the resist is removed, and the planer shape channel region is selectively protected by a resist, and the channel of triangle cross-sectional shape is formed by the crystal anisotropic etching depicted in the paragraph 0025. (2) After the gate oxide film is formed as depicted in the above-mentioned paragraph 0026, subsequently the thin film fixed gate electrode is deposited, and thereafter, only the thin film fixed gate electrodes 80-1 and 80-2 on the channel regions are selectively formed by EB lithography and RIE, and then, the resist is removed. (3) At the time of the sacrifice layer pattern formation in the above-mentioned paragraph 0026, a resist pattern is formed only on the movable gate electrode region, and the resist pattern is not formed on the fixed gate electrode region. (4) When the sacrifice layer region is opened selectively as depicted in the above-mentioned paragraph 0031, only the movable gate region is selectively opened to etch the sacrifice layer. Thereby, completed is the fabrication of the integrated circuit that co-integrates a movable gate field-effect transistor having a triangle cross-sectional shape channel provided with a thin film fixed gate electrode according to the present invention and the planer field-effect transistor having a fixed gate electrode.

By the movable gate field-effect transistor of triangle cross-sectional shape fabricated on the SOI substrate having (100) orientation illustrated as an embodiment of the present invention, a leakage current from a conventional gate electrode can be made zero, and the theoretical limit, in the room temperature, of the sub-threshold coefficient S=60 mV/decade can be overcome. In addition, by consolidating a movable gate and a fixed double gate field-effect transistor, the integrated circuit that is energy saving extremely at the time of standby, and is high-speed at the time of operation can be constituted.

The invention claimed is:

1. A field-effect transistor, comprising:
   an insulating substrate;
   a semiconductor layer of triangle cross-sectional shape formed on the insulating substrate, having a gate insulation film on a surface, and forming a channel in a lateral direction;
   fixed electrodes that are arranged adjacent to both sides of the semiconductor layer and in parallel with the semiconductor layer, each of the fixed electrodes having an insulation film on a surface;
   a source/drain formed at the end part of the semiconductor layer; and
   a movable gate electrode formed above the semiconductor layer and the fixed electrodes with a gap.

2. The field-effect transistor according to claim 1, wherein the field-effect transistor is in a state where a current flows between the source and the drain when the gate electrode is firmly attached to the gate insulation film, and wherein the field-effect transistor is in a state where a current does not flow between the source and the drain when the gate electrode is separated from the gate insulation film.

3. The field-effect transistor according to claim 1, wherein depending on existence or nonexistence of a voltage application between the fixed electrodes and the movable gate electrode, the movable gate electrode is firmly attached to the gate insulation film by utilizing an electrostatic attraction force caused between the movable gate electrode and the fixed electrodes, and the movable gate electrode is separated from the gate insulation film by utilizing a restoring force based on a spring effect of the movable gate electrode.

4. The field-effect transistor according to claim 1, wherein the fixed electrodes are electrically connected with a source electrode region.

5. The field-effect transistor according to claim 1, wherein the channel in the lateral direction is two or more multi-channels.

6. The field-effect transistor according to claim 1, wherein the insulating substrate is a SOI substrate, wherein each of the surfaces of both sides of the channel in the lateral direction of triangle cross-sectional shape is crystalline silicon in (111) orientation.

7. An integrated circuit comprising the field-effect transistor according to claim 1.

8. The field-effect transistor according to claim 2, wherein depending on existence or nonexistence of a voltage application between the fixed electrodes and the movable gate electrode, the movable gate electrode is firmly attached to the gate insulation film by utilizing an electrostatic attraction force caused between the movable gate electrode and the fixed electrodes, and the movable gate electrode is separated from the gate insulation film by utilizing a restoring force based on a spring effect of the movable gate electrode.

9. A field-effect transistor comprising:
   an insulating substrate;
   a semiconductor layer of triangle cross-sectional shape formed on the insulating substrate, having a gate insulation film on a surface, and forming a channel in a lateral direction;
   fixed electrodes that are arranged adjacent to both sides of the semiconductor layer and in parallel with the semiconductor layer, each of the fixed electrodes having an insulation film on a surface;
   a source/drain formed at the end part of the semiconductor layer; and
   a movable gate electrode formed above the semiconductor layer and the fixed electrodes with a gap, wherein the field-effect transistor further comprises a thin film fixed gate electrode on the gate insulation film.

10. The field-effect transistor according to claim 9, wherein the field-effect transistor is in a state where a current flows between the source and the drain when the gate electrode is firmly attached to the thin film fixed gate electrode on the gate insulation film, and wherein the field-effect transistor is in a state where a current does not flow between the source and the drain when the gate electrode is separated from the thin film fixed gate electrode on the gate insulation film.

11. The field-effect transistor according to claim 10, wherein depending on existence or nonexistence of a voltage application between the fixed electrodes and the movable gate electrode, the movable gate electrode is firmly attached to the thin film fixed gate electrode by utilizing an electrostatic attraction force caused between the movable gate electrode and the fixed electrodes, and the movable gate electrode is separated from the thin film fixed gate electrode by utilizing a restoring force based on a spring effect of the movable gate electrode.

12. The field-effect transistor according to claim 9, wherein depending on existence or nonexistence of a voltage application between the fixed electrodes and the movable gate electrode, the movable gate electrode is firmly attached to the thin film fixed gate electrode by utilizing an electrostatic attraction force caused between the movable gate electrode and the fixed electrodes, and the movable gate electrode is separated from the thin film fixed gate electrode by utilizing a restoring force based on a spring effect of the movable gate electrode.

13. The field-effect transistor according to claim 9, wherein a potential of the thin film fixed gate electrode can be controlled independently.

14. The field-effect transistor according to claim 9, wherein the fixed electrodes are electrically connected with a source electrode region.

15. The field-effect transistor according to claim 9, wherein the channel in the lateral direction is two or more multichannels.

16. The field-effect transistor according to claim 9, wherein the insulating substrate is a SOI substrate, wherein each of the surfaces of both sides of the channel in the lateral direction of triangle cross-sectional shape is crystalline silicon in (111) orientation.

17. An integrated circuit comprising the field-effect transistor according to claim 9.

* * * * *